United States Patent [19]
Shiell

[11] Patent Number: 6,041,176
[45] Date of Patent: Mar. 21, 2000

[54] EMULATION DEVICES UTILIZING STATE MACHINES

[75] Inventor: Jonathan H. Shiell, Plano, Tex.

[73] Assignee: Texas Instruments Incorporated, Dallas, Tex.

[21] Appl. No.: 09/032,656

[22] Filed: Feb. 27, 1998

[51] Int. Cl.[7] .................................................. G06F 9/455
[52] U.S. Cl. ................................ 395/500.48; 364/264.3; 364/264.5; 712/210
[58] Field of Search ............................. 395/500; 364/578, 364/264.3; 371/22.1; 712/210

[56] References Cited

U.S. PATENT DOCUMENTS

| | | | |
|---|---|---|---|
| 4,890,218 | 12/1989 | Bram ........................................ | 712/210 |
| 5,329,471 | 7/1994 | Swoboda et al. .................. | 395/500.44 |

*Primary Examiner*—Kevin J. Teska
*Assistant Examiner*—Samuel Broda
*Attorney, Agent, or Firm*—Robert D. Marshall, Jr.; Gerald E. Laws; Richard L. Donaldson

[57] ABSTRACT

An emulation device which enables a functional circuit to support self emulation. A serial scan testability interface has at least first, second and third scan paths, said first scan path being provided for applying digital information to the functional circuit for use in emulation of the functional circuit. A first state machine connected to said second scan path has a first state selected from among a first set of states. A second state machine connected to said third scan path has a second state selected from among a second set of states. The emulation device performs an emulation command based on a combined first state of said first state machine and second state of said second state machine. The state of the first state machine indicates a primary portion of the emulation command denoting an emulation command class. The state of the second state machine indicates a secondary portion of the emulation command consisting of a subtype within the emulation command class. Both state machines return to a default "no-op" state following performance of an emulation command prior to accepting new data. The first scan path is used for JTAG when the first state machine is the default "no-op" state. Alternatively, the first scan path is used for JTAG when the first state machine is a "normal JTAG operation" command class. An unused JTAG command indicates to the first state machine that the following bit string is a command class and not a JTAG operation.

32 Claims, 18 Drawing Sheets

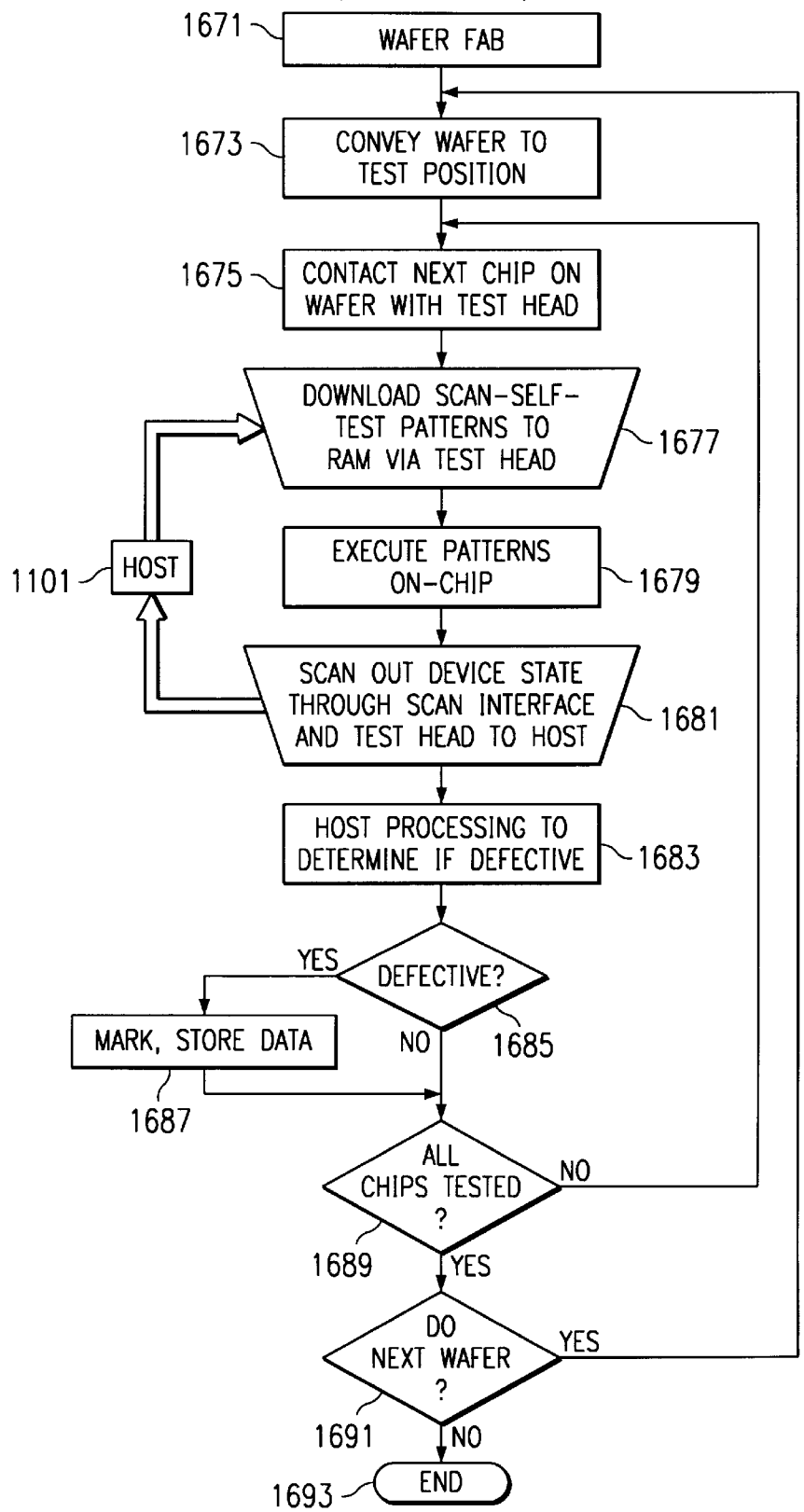

EMULATION DEVICES UTILIZING STATE MACHINES

TECHNICAL FIELD OF THE INVENTION

The technical field of this invention is electronic data processing and emulation, simulation, and testability devices and systems, and methods of their manufacture and operation.

BACKGROUND OF THE INVENTION

Advanced wafer lithography and surface-mount packaging technology are integrating increasingly complex functions at both the silicon and printed circuit board level of electronic design. Diminished physical access is an unfortunate consequence of denser designs and shrinking interconnect pitch. Designed-in testability is needed, so that the finished product is still both controllable and observable during test and debug. Any manufacturing defect is preferably detectable during final test before a product is shipped. This basic necessity is difficult to achieve for complex designs without taking testability into account in the logic design phase, so that automatic test equipment can test the product.

In addition to testing for functionality and for manufacturing defects, application software development requires a similar level of simulation, observability and controllability in the system or sub-system design phase. The emulation phase of design should ensure that an IC (integrated circuit), or set of ICs, functions correctly in the end equipment or application when linked with the software programs.

With the increasing use of ICs in the automotive industry, telecommunications, defense systems, and life support systems, thorough testing and extensive real-time debug becomes a critical need.

Functional testing, wherein a designer is responsible for generating test vectors that are intended to ensure conformance to specification, still remains a widely used test methodology. For very large systems this method proves inadequate in providing a high level of detectable fault coverage. Automatically generated test patterns would be desirable for full testability, and controllability and observability are key goals that span the full hierarchy of test (from the system level to the transistor level).

Another problem in large designs is the long time and substantial expense involved. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation approach, a large of subsequent design time is expended on test pattern creation and grading.

Even if a significant investment were made to design a module to be reusable and to fully create and grade its test patterns, subsequent use of module may bury it in application specific logic, and make its access difficult or impossible. Consequently, it is desirable to avoid this pitfall.

The advances in IC design, for example, are accompanied by decreased internal visibility and control, reduced fault coverage and reduced ability to toggle states, more test development and verification problems, increased complexity of design simulation and continually increasing cost of CAD (computer aided design) tools. In the board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment even into the 7-figure range, and tighter tolerances.

SUMMARY OF THE INVENTION

An emulation device which enables a functional circuit to support self emulation. A serial scan testability interface has at least first, second and third scan paths, said first scan path being provided for applying digital information to the functional circuit for use in emulation of the functional circuit. A first state machine connected to said second scan path has a first state selected from among a first set of states. A second state machine connected to said third scan path has a second state selected from among a second set of states. The emulation device performs an emulation command based on a combined first state of said first state machine and second state of said second state machine.

The first state machine transmits state information corresponding to the first state to the second state machine. Alternatively, the state machines transmit state information to each other. The state of the first state machine indicates a primary portion of the emulation command denoting an emulation command class. The state of the second state machine indicates a secondary portion of the emulation command consisting of a subtype within the emulation command class.

The emulation device performs the emulation command only if both state machines are updated by their respective scan paths. Both state machines return to a default "no-op" state following performance of an emulation command prior to accepting new data. The first and second state machines may only accept new data only if in the default state. The emulation command can only be performed if both machines are not in the default state.

The first scan path is used for JTAG when the first state machine is the default "no-op" state. Alternatively, the first scan path is used for JTAG when the first state machine is a "normal JTAG operation" command class. An unused JTAG command indicates to the first state machine that the following bit string is a command class and not a JTAG operation.

BRIEF DESCRIPTION OF THE DRAWINGS

These and other aspects of this invention are illustrated in the drawings, in which:

FIG. 21 is a process flow diagram of operation of the testing system of FIG. 20;

DETAILED DESCRIPTION OF PREFERRED EMBODIMENTS

Figure 1:
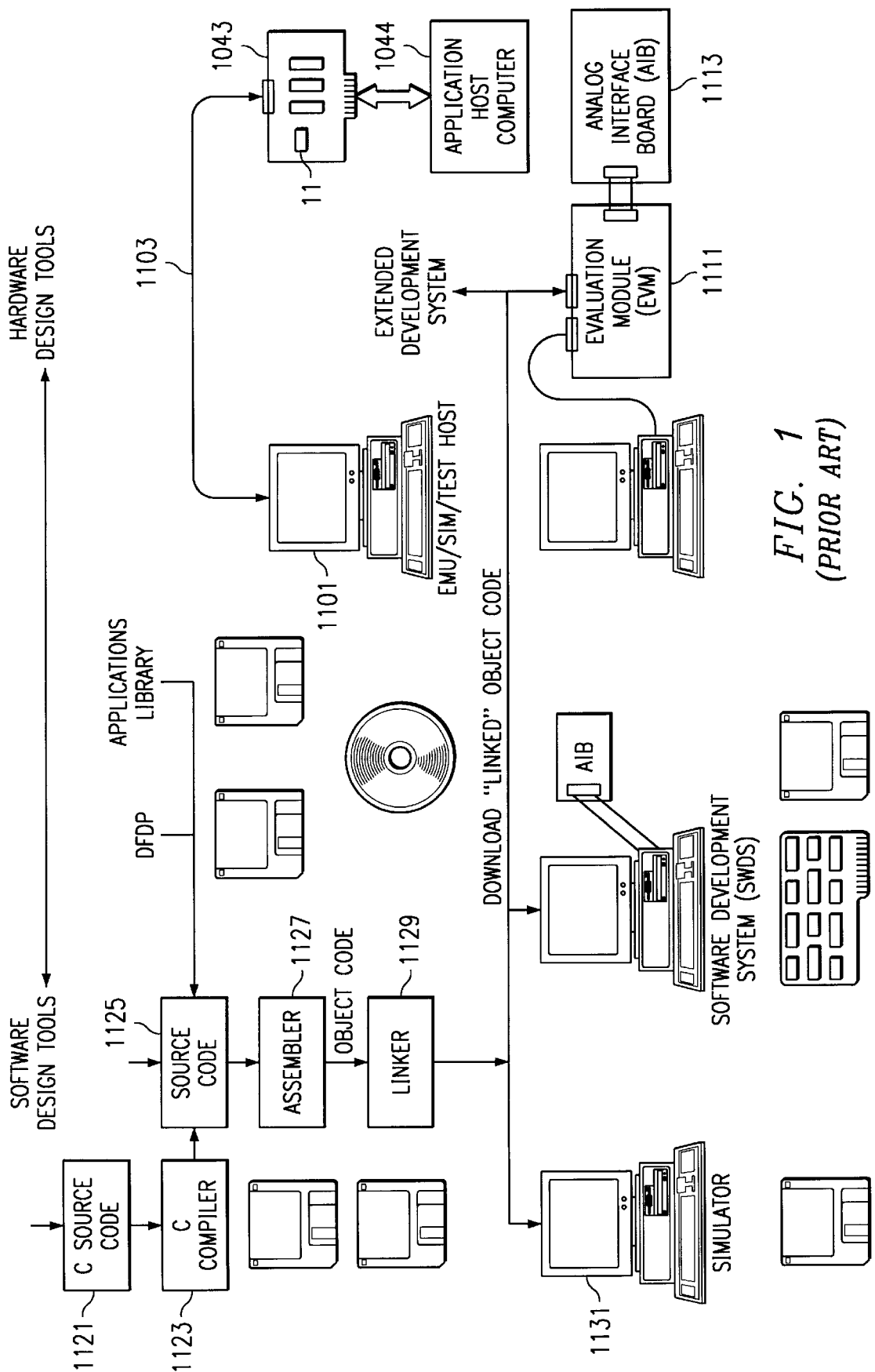
FIG. 1 is a pictorial diagram of development tools for developing integrated circuit chips and software.

A device 11, described in the coassigned applications and further described herein, is adapted for sophisticated interfacing with development tools illustrated in FIG. 1. Hardware design tools include an extended development system 1101 interfaced by a serial line 1103 to a circuit board 1043 holding device 11. Circuit board 1043 is advantageously operable with application host computer 1044. Also provided in the development tools are an evaluation module 1111 connected to an analog interface board AIB 1113.

A software development system SWDS provides for user entry of source code 1121 in the C computer language which source code then is compiled by a C compiler 1123 into code 1125.

C compiler 1123 is an optimizing compiler fully implementing the standard Kernighan and Ritchie C language, for instance. The compiler 1123 accepts programs written in C and produces assembly language source code, which is then converted into object code by the assembler 1127. This high-level language compiler 1123 allows time-critical routines written in assembly language to be called from within the C program. Conversely, assembly routines may call C functions. The output of the compiler is suitably edited before assembly and link to further optimize the performance of the code. The compiler 1123 supports the insertion of assembly language code into C source code, so that the relative proportions of high-level and assembly language code are tailored according to the needs of a given application.

The code 1125 is assembled by an assembler 1127 into relocatable object code. A linker 1129 produces non-relocatable machine code or linked object code which is then downloaded into the device 11 through the development system.

Assembler 1127 and linker 1129 comprise a software development tool that converts assembly language files into executable object code. Key features are macro capabilities and library functions, conditional assembly, relocatable modules, complete error diagnostics, and symbol table and cross reference. Four programs address specific software development needs, discussed next.

The assembler 1127 translates assembly language source files into machine language object files. Source files contain instructions, assembler directives and macro directives. Assembler directives are used to control various aspects of the assembly process, such as the source listing format, data alignment and section content.

The linker 1129 combines object files into a single executable object module. As the linker creates an executable module, it performs relocation and resolves external references. The linker accepts relocatable object files created by the assembler as input. It also accepts archive library members and output modules created by a previous linker run. Linker directives allow combining or binding of file sections or symbols to addresses and defining or redefining global symbols.

An archiver allows collection of a group of files into a single archive file. For example, several macros are suitably collected into a macro library. The assembler searches through the library and uses the members that are called as macros by the source code 1125. The archiver also suitably collects a group of object files into an object library such as files that resolve external references during linking.

An object format converter converts an object file into any one of several EPROM programmer formats, such as TI-TAG format. The converted file is then downloaded to an EPROM programmer so that the EPROM code so established is then executed on the device 11 target chip in system 1043.

Simulator 1131 executes a software program that simulates operation of the target chip for cost-effective software development and program verification in non-realtime. The simulator simulates the entire target chip instruction set and simulates the key peripheral features including DMA, timers and serial port when the target chip includes them. Command entry is accepted from either menu-driven keystrokes (menu mode) or from a batch file (line mode). Help menus are provided for all screen modes. Its standard interface can be user customized. Simulation parameters are quickly stored/retrieved from files to facilitate preparation for individual sessions. Reverse assembly allows editing and reassembly of source statements. Memory is displayed as hexadecimal 32 bit values and assembled source code, separately or at the same time.

Simulator 1131 execution modes include 1) single/multiple instruction count, 2) single/multiple cycle count, 3) Until Condition Is Met, 4) While Condition Exists, 5) For Set Loop Count and 6) Unrestricted Run with Halt by Key Input. Trace expressions are readily defined. In trace execution, display choices include 1) designated expression values, 2) cache registers, and 3) instruction pipeline for easy optimization of code. Breakpoint conditions include Address Read, Address Write, Address Read or Write, Address Execute, and Expression Valid. Simulator 1131 simulates cache utilization and does cycle counting. For example, in cycle counting the number of clock cycles in single step mode or run mode are displayed. External memory is suitably configured with wait states for accurate cycle counting.

Simulator 1131 accepts object code produced by the assembler 1127 and linker 1129. Input and output files are suitable associated with the port addresses of the I/O instructions to simulate I/O devices connected to the processor. Before starting program execution, any breakpoints are set and the trace format defined.

During program execution on simulator 1131, the internal registers and memory of the simulated target chip are modified as each instruction is interpreted by the simulator 1131. Execution is suspended when a breakpoint or error is encountered or when execution is halted. When program execution is suspended, the internal registers and both program and data memories can be inspected and modified. A trace memory is also displayable. A record of the simulation session can be maintained in a Journal file so that it can be re-executed to regain the same machine state during another simulation session.

The simulator 1131 allows verification and monitoring of the state of the target chip without the requirements of hardware. Simulation speed is on the order of hundreds or thousands of instructions per second depending on the operating system and hardware selected for simulator 1131. A state-accurate simulation might be as slow as 1–2 instructions per second. Emulation at the higher real-time functional clock rate is performed by development system 1101 instead of simulator 1131.

Simulator 1131 provides for complete computer simulation not only of the device 11, but also its peripherals on the board 1043 through file I/O for example.

Extended development system 1101 provides full-speed, in-circuit emulation for system design and for hardware and software debug on widely available personal computer systems. The development tools provide technological support from system concept to prototype. The development system elements provide ease of use and offer the designer the tools needed to significantly reduce application system development time and cost to put designs into production faster.

Figure 2:
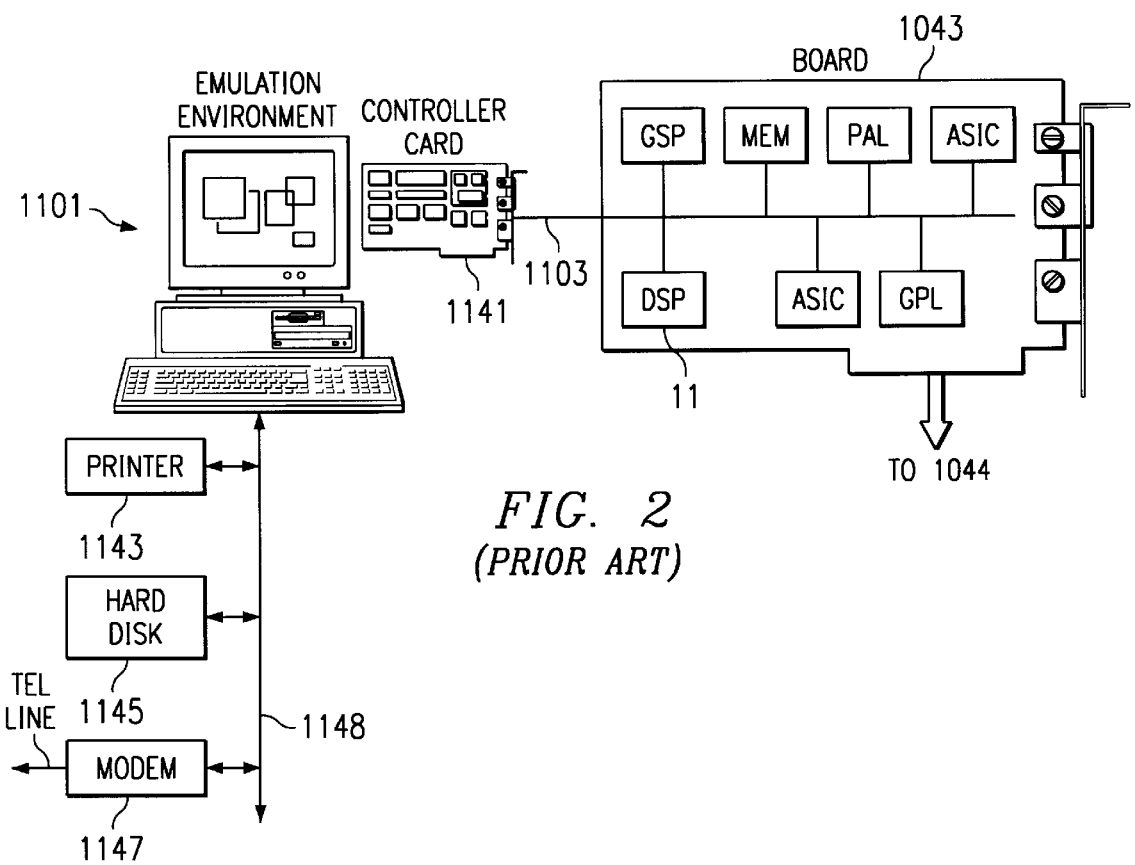
FIG. 2 is a partially pictorial, partially block diagram of a system configuration for emulation, simulation, testability and attached processor data processing, communications I/O and peripheral access.

FIG. 2 illustrates in even more detail the emulation environment provided by the extended development system 1101. A controller card 1141 compatible with IEEE JTAG standards is included in the emulation host computer 1101. This controller card 1141 communicates by serial line 1103 to PC board 1043 and DSP device 11 of FIG. 2. System 1043 has Texas Instruments Scope (TM) testability meshed with Texas Instruments MPSD (Modular Port Scan Design) emulation for a complete solution from development, through manufacture, and including field test. The inventive approaches are applicable in digital signal processors (DSP), graphics signal processors (GSP), memories (MEM), programmable array logic (PAL), application specific integrated circuits (ASIC), and general purpose logic (GPL) general purpose Micro Computers and Micro processors, and any device requiring test or code development.

Host computer 1101 of FIG. 2 has peripherals including a printer 1147, hard disk 1145, and telecommunications modem 1143 connected to a telephone line for uploading to a remote mainframe in field test and other procedures. The peripheral capabilities of bus 1148 of host computer 1101 are not only available for emulation, but also provide access by application system 1043 to these peripherals along serial line 1103. Host computer 1101 thus is not only available to the system 1043 as an emulation host but also as an attached processor itself and as a port for communications I/O and to other peripheral capabilities temporarily needed by system 1043 but ordinarily unavailable to system 1043.

Figure 3:
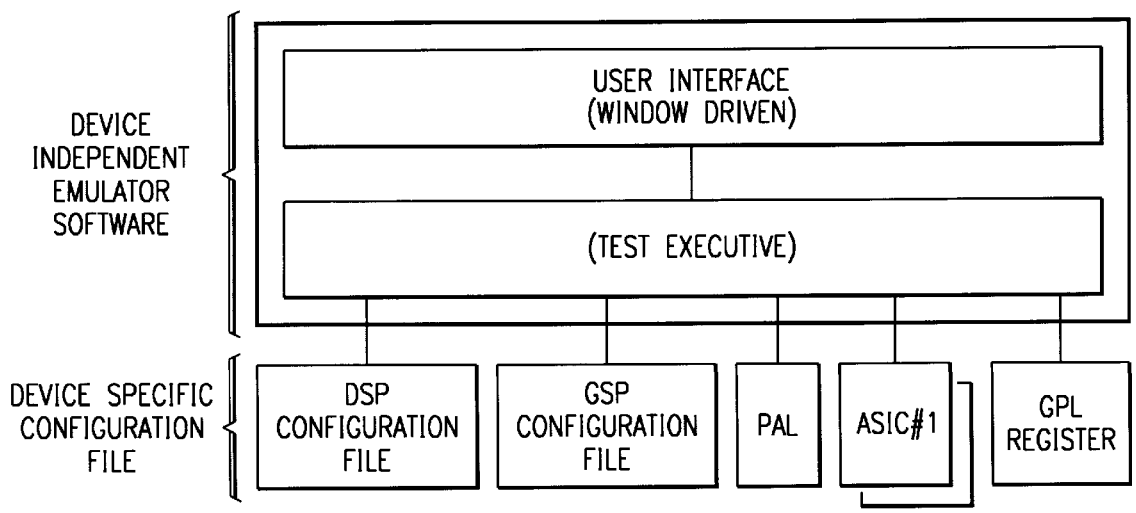
FIG. 3 is a diagram of a software configuration for a host computer of FIG. 2.

FIG. 3 illustrates an emulation and simulation software configuration for computer 1101 wherein device independent emulator software has a window driven user interface and a test executive program.

Device specific configuration files for each of the devices on board 1043 are provided. For example, there is a DSP configuration file, a GSP (graphic signal processor) configuration, a programmable array logic (PAL) file, an ASIC file and a GPL register file.

The emulation hardware and software of FIGS. 2 and 3 provide a user-friendly, personal-computer or work station-based development system which provides all the features necessary to perform full-speed in-circuit emulation with target chips on board 1043. For example, DSP 11 is suitably a Texas Instruments 320 series digital signal processor disclosed in coassigned application Ser. No. 025,417, issued Mar. 27, 1990 (U.S. Pat. No. 4,912,636) filed Mar. 13, 1987 and hereby incorporated herein by reference; or a 320C50 digital signal processor disclosed in U.S. Pat. No. 5,072,418 which is incorporated herein by reference. An exemplary graphics signal processor is the Texas Instruments 34020 GSP disclosed in the GSP coassigned applications incorporated hereinabove and having inventive emulation circuitry more fully described hereinbelow.

The emulator comprised of FIG. 2 host computer 1101 with controller card 1141 and software of FIG. 3 allows the user to perform software and hardware development, and to integrate the software and hardware with the target system. An important emulation interface provides control and access to every memory location and register of the target chip and extend the device architecture as an attached processor.

Emulator controller card 1141 provides full-speed execution and monitoring of each target chip such as device 11 in the user's target system 1043 via a multi-pin target connector. In one embodiment, thirty software and hardware breakpoints, software and hardware trace and timing, and single-step execution are provided. The emulator has capability to load, inspect, and modify all device 11 registers. Program data and program memory can be uploaded or downloaded. The user interface of host computer 1101 for emulation purposes is a windowed user interface designed to be identical to the windowed user interface of simulator 1131 for the corresponding target chip. The emulator 1101 is portable and reconnectable for multiprocessing. Emulator 1101 provides a benchmark of execution time clock cycles in realtime.

Full-speed execution and monitoring of the target system is suitably controlled via a multi-wire interface or scan path in the multi-pin target connector. The scan path controls the target chip in the system 1043, providing access to all the registers as well as associated internal and external memory.

Program execution takes place on the target chip (e.g. 11) in the target system 1043. Accordingly, there are no timing differences during emulation, as might occur without the in-circuit emulation provided by this preferred embodiment. Heretofore, emulation may have involved sending signals over a cable to emulate the target chip 11 in its absence. Advantageously, the present embodiment is a non-intrusive system that utilizes chip 11 itself, and avoids cable length and transmission problems. Loading problems on signals are avoided, and artificial memory limitations are obviated. Emulation performance coincides with specifications for the emulated target chip itself.

Software breakpoints allow program execution to be halted at a specified instruction address. Hardware breakpoints are also advantageously operative on-chip. When a given breakpoint is reached, the program either halts execution to permit user observation of memory and status registers, or the breakpoint is included in a more complex condition, which when satisfied results in an appropriate stop mode being executed. At this point, the status of the target chip or system is available for display by the user with as little as a single command.

Software trace and hardware program counter trace permit the user to view the state of target chip 11 when a breakpoint is reached. This information is suitably saved on command in a file for future analysis. Software timing allows the user to track clock cycles between breakpoints for benchmarking time critical code.

Single-step execution gives the user the ability to step through the program one instruction at a time. After each instruction, the status of the registers and CPU are displayed. This provides greater flexibility during software debug and helps reduce development time.

Object code is downloaded on command to any valid program memory location or data memory location via the interface. Downloading a 1K-byte object program illustratively takes on the order of 100 milliseconds. By inspecting and modifying the registers while single-stepping through a program, the user can examine and modify program code or parameters.

A windowed user interface for emulator 1101 is suitably made identical to that of simulator 1131, affording a straightforward migration from simulator-based development to emulator-based development. The user-friendly screen displays the program code in mnemonics and equivalent hexadecimal code. Windowed displays are suitably provided for extended precision registers, the CPU status and memory locations.

A first screen option is a primary screen that includes a command line displayed at top of screen, functions of special-function keys, and four status windows which are individually accessed using the F1 key of commercially available keyboards. The windows include a source code window, an auxiliary display window, a CPU status window, and an extended precision registers window. The contents of the windows are made accessible for user inspection and modification.

Commands are entered in a MENU mode or a LINE mode. In the MENU mode, a menu at the top of the screen permits the user to view every option available while entering a single command. Further menus are then displayed until the entire command has been entered. The LINE mode allows user to enter an entire command expression.

Emulator card 1141 of FIG. 2 suitably occupies slots in an IBM PC-XT/AT computer when the latter is used as host computer 1101. The card 1141 is detached and transferred to another PC (personal computer of equivalent functionality) as needed, affording emulator portability. For simulation, a memory map for the controller card 1141, which may include EPROM (erasable programmable read only memory), SRAM (static random access memory), DRAM (dynamic random access memory), and on-chip memory and peripherals, can be configured by the designer to reflect the actual environment of the target system 1043, including wait states and access privileges. In this way, card 1141 and host computer 1101 simulate peripherals which are as yet absent from board 1043 in a particular development context.

In one embodiment, multiprocessing applications are emulated by extending line 1103 between each of several application boards from one to the next, maintaining real-time emulation and preserving the information on each target chip.

The development system 1141 operates in two modes emulation mode and algorithm development and verification mode. In the algorithm verification mode, the target chip 11 debugs its software at full speed before the target system is complete. To accomplish this, code is downloaded into the memory on the board 1043 and executed at full speed via the interface on an application board used in place of the incomplete target system. A suitable application board includes a DSP 11, 16K×32 bits of full-speed (zero wait states) SRAM on a primary bus, two selectable banks of 8K×32 bits full speed (zero wait state) SRAM on an expansion bus, and 512K×32 bits DRAM. With ample SRAM, the user has realtime emulation capabilities and memory storage flexibility for a variety of algorithms. Zero wait state capability in SRAM allows memory read/write in realtime.

For algorithm development and code verification the system can single step and run until breakpoint is reached. Algorithm verification runs data through the algorithm and verifies its function. Burst execution, I/O and other functions are available.

Page mode DRAM improves bulk storage performance. Three types of DRAM cycles are used on one example of an application board. These are single-word read, single-word write and page-mode read which respectively have wait states of four, two, and one wait state per access. Page mode read cycles are automatically evoked when device 11 performs two or more back-to-back read cycles on the same memory page (256 words) Utilizing page-mode results in a decrease in wait states when accessing on application board 1043 DRAM on application board 1043.

In FIG. 2 both test and development support system access to the application system resource is via a serial scan bus master or scan interface on controller card 1141, and described later hereinbelow. Sophisticated emulation and simulation functions are built out of primitives. Primitives are sets of bits that define control operations (like commands or instructions) available through controller card 1141.

Figure 4:
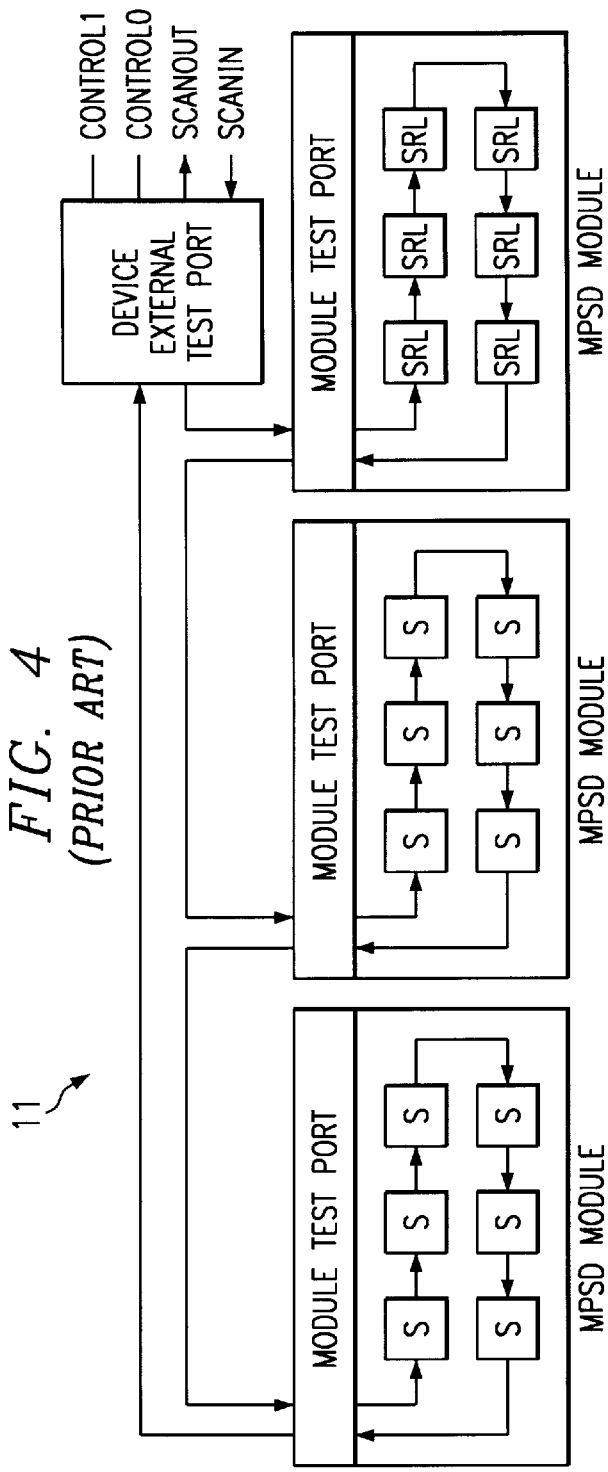
FIG. 4 is a block diagram of a modular port scan (MPSD) arrangement.

The functionality of the device 11 can be accessed by each of two illustrative inventive serial implementations. A first implementation is Texas Instruments Modular Port Scan Design (MPSD) as shown in FIG. 4 and disclosed in coassigned application Ser. No. 057,078 issued Aug. 22, 1989, (U.S. Pat. No. 4,860,290) and incorporated herein by reference. Shift register latches (SRLs) designated "S" are distributed through the device 11 like a string of beads on a serial scan path respective to each module to provide access to all important registers.

Figure 5:
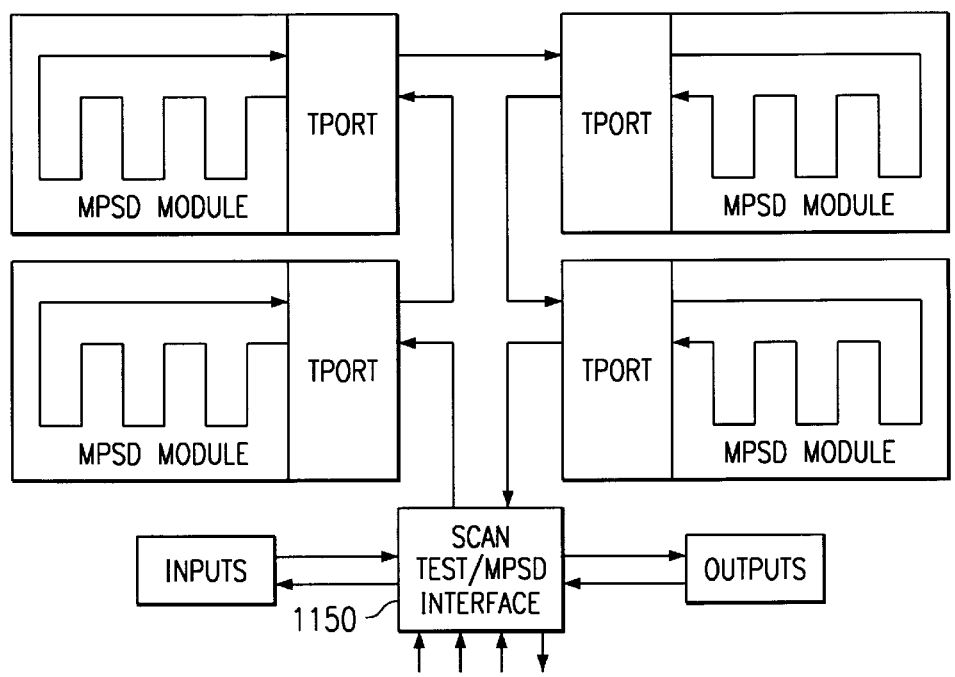
FIG. 5 is a block diagram of a scan test/MPSD configuration.

In FIG. 5, a second approach uses a SCOPE transmission medium combined with MPSD technology in a SCOPE interface 1150.

Figure 6:
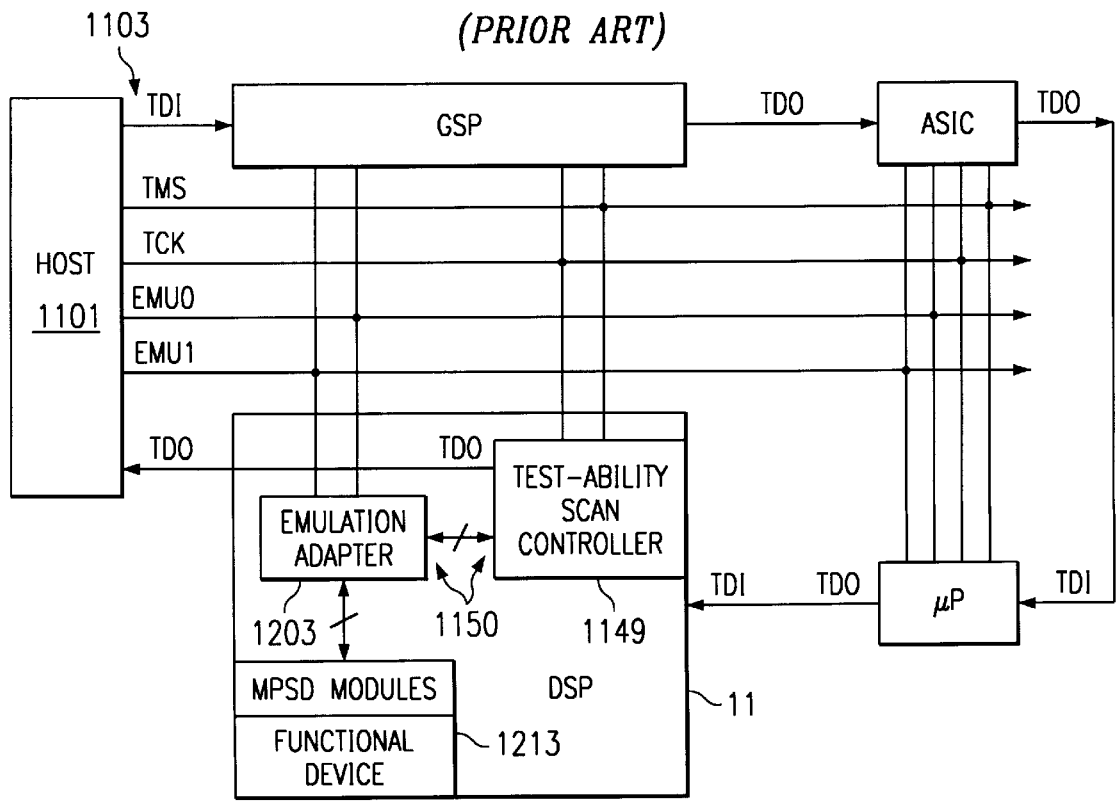
FIG. 6 a block diagram of an integrated approach to test and emulation circuitry.

In FIG. 6 device 11 has an on-chip JTAG interface 1149 as described herein. The scan interface is connected to line 1103 of FIG. 2 and has inputs for test clock TCK, mode select TMS, and test data input TDI (scan in), as well as a test data output TDO (scan out). A special emulation adapter 1203 is connected between the scan interface 1149 and MPSD modules of the functional circuitry 1213 of device 11. Emulation adapter 1203 in different forms involves hardwired state machine circuitry, assembly language, or microcoded state machine embodiments. The characteristics of some implementations when used in support of emulation are shown in Table I:

TABLE I

|  | MPSD | SCOPE | SCOPE/MPSD |
| --- | --- | --- | --- |
| Industry Standard Communication | No | Yes | Yes |
| Max Clock Period | Depends | Unlimited | Unlimited |
| Functional Clock Independence | No | Yes | Yes |
| Boundary Scan Support | No | Yes | Yes |
| Silicon Efficiency | Yes | No | Yes |
| Most Emulation Capability | No | Yes | Yes |
| Number of Extra Pins | Four | Six | Six |

The implementation SCOPE/MPSD capitalizes on the strengths of MPSD and SCOPE individually to create a hybrid emulation technology.

Figure 7:
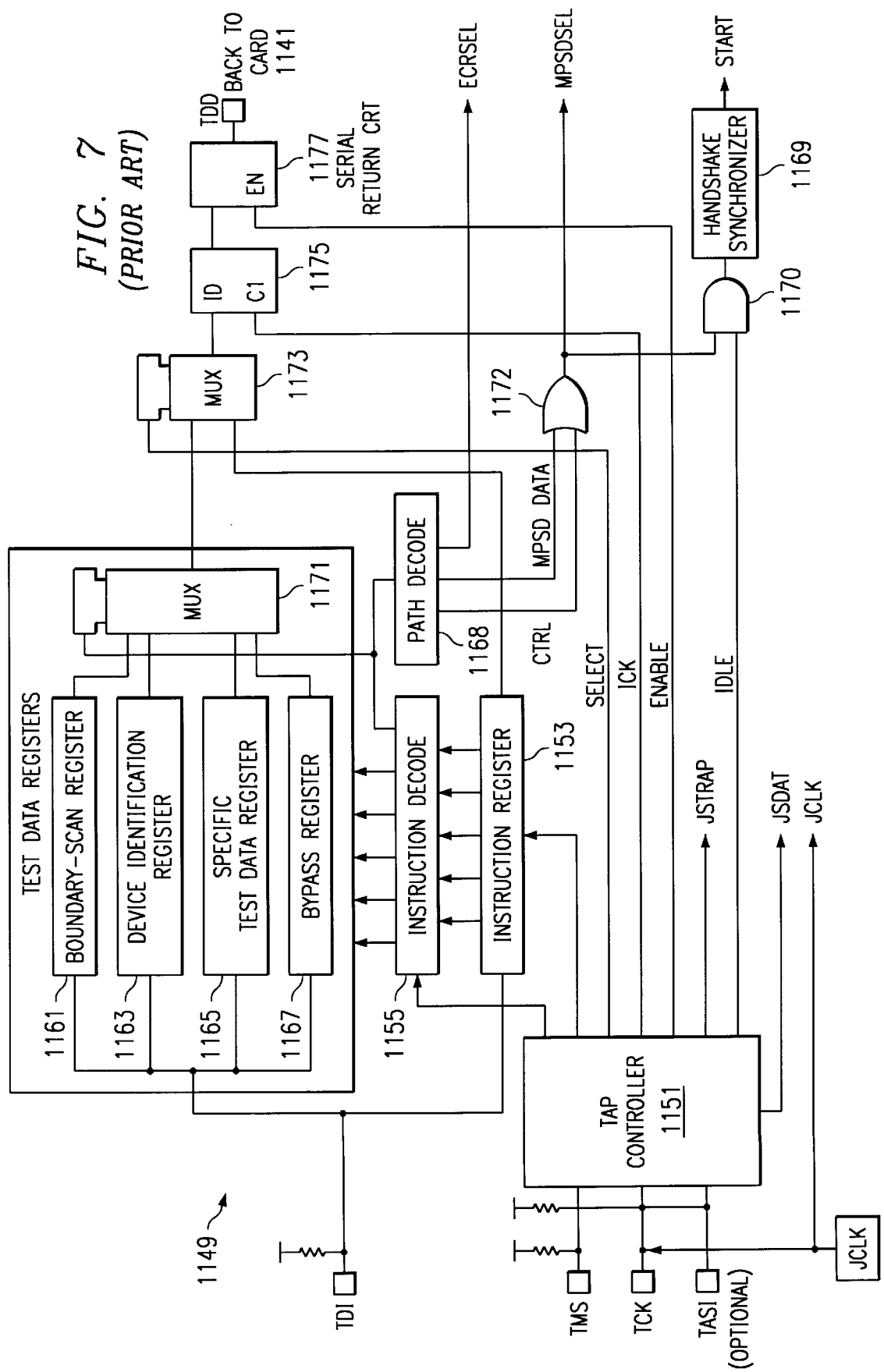
FIG. 7 is a partially block, partially schematic diagram of a scan testability interface.

FIG. 7 shows a block diagram of improved SCOPE hardware which is provided on each of the chips such as device 11 on PC board 1043. Four pins TDI, TM8, TCK and TDO communicate with the system. TMS and TCK communicate with a tap controller 1151 which is connected to an instruction register 1153 and an instruction decoding circuit 1155.

Test access port (TAP) controller 1151 is in turn coupled to instruction register (IR) 1153 and a first multiplexer 1173. The instruction register can receive serial scan signals from the TDI line and output serially to MUX 1173. MUX 1173 is under control of the TAP and can select the output signal from the instruction register or from another MUX 1171.

The instruction register also controls a bypass register (BR) 1167 and one or more boundary scan registers (BSR) 1161. The bypass register receives the TDI signal and outputs it to MUX 1171. MUX 1171 is under control of the instruction register 1153. Based on the instruction loaded into the instruction register, MUX 1171 outputs its input from the bypass register or its input from one or more BSRs, or internal device register scan. Each boundary scan register is controlled via the test access port and the instruction register.

The boundary scan arrangement operates in a normal mode or a test mode. During the normal mode, input data entering terminals of IC logic passes through the boundary scan register, into the IC logic and out to the normal output terminals without any change due to the BSR. During the test mode, normal input data is interrupted, and test input data is captured, shifted, and updated within the boundary scan register. The boundary scan register includes two memories, a first memory for receiving and shifting data from the TDI line and a second memory for holding output data. The second memory is selectively operable to transfer data from the first memory to the second memory.

Generally, in FIG. 7, serial information is down loaded from emulation computer 1101 via the SCOPE controller card 1141 through pin TDI and enters any one of a number of shift registers, including a boundary scan register 1161, a device identification register 1163 and design specific test data registers 1165. A bypass register 1167 is also provided. These shift registers or serial scan registers are selected via a MUX 1171 under the control of instruction decode circuitry 1155. The selected output from MUX 1171 is fed to a MUX 1173 so that under control of tap controller 1151 the instruction register 1153 or MUX 1171 is selected by MUX 1173. JTAG clock TCK and MUX 1173 output are fed to flip flop 1175 which in turn is connected to a serial return circuit 1177 which is suitably enabled to return or send serial outputs from all parts of the on-chip JTAG circuitry back to computer JTAG card 1141 via output serial pin TDO.

Figure 8:
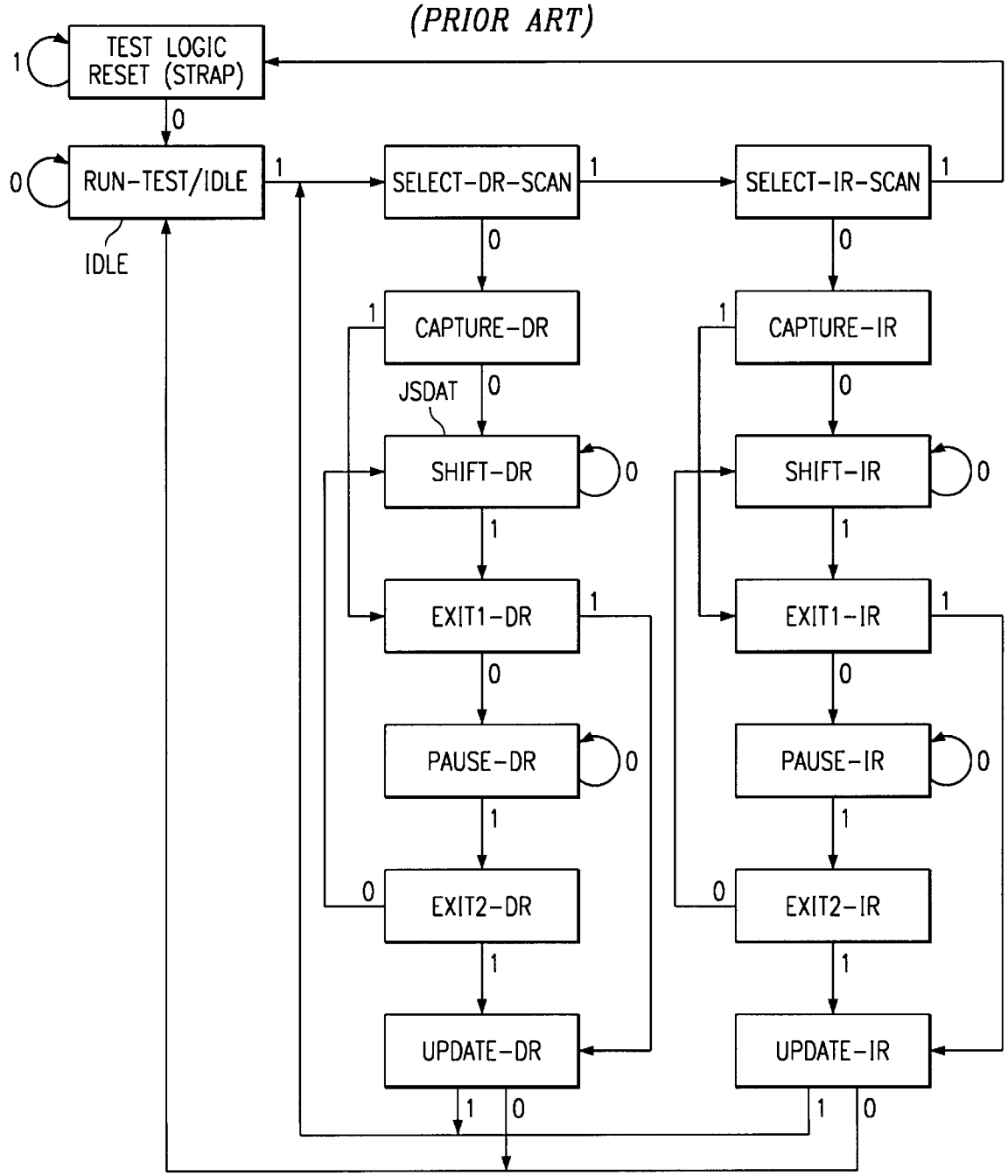
FIG. 8 is a state transition diagram of a test access port (TAP) controller in FIG. 7.

In FIG. 8 a state transition diagram of TAP controller 1151 has one and zero signal values entered adjacent to each state transition arc. These are values of signal TMS at the time of a rising edge on signal TCK. The states of the JTAG TAP (Test Access Port) controller are described in "A Standard Test Bus and Boundary Scan Architecture" by L. Whetsel, Texas Instruments Technical Journal, Vol. 5, No 4, 1988, pp 48–59 and in above-referenced documents Ser. Nos. 08/108, 775 and 08/087,020 and U.S. Pat. Nos. 5,084,874 and 4,872,169.

Turning to basic concepts recognized and utilized herein, emulation involves hardware support built around each circuit so that operations can be executed within the circuit while doing analysis in parallel as the circuit runs. Emulation permits the circuits to be run at full speed in real time as the emulator computer 1101 monitors the circuits and starts and stops them. The user defines and develops software in the environment of the target system. Put another way, emulation reads inputs from the board 1043 and produces outputs to the board as if device 11 were absent, for the purpose of determining appropriate software and operation signals. Ultimately, when the device 11 is supplied with the appropriate software resulting from emulation work, the device 11 operates in a manner which is compatible with the rest of the circuitry of board 1043. Advantageously, in the improved system disclosed herein, the device 11 is actually on the board and with the serial communication capabilities, all of the operations of device 11 are monitored directly from the device itself. In view of the extremely high speed of device 11, the device itself assists in its own emulation.

In a previous approach, a cable is terminated in a pin-plug that mates to a socket provided on the board in place of the emulated device. The socket introduces a noise issue. A socket may be impractical when a surface mount device is to be emulated, due to limited board space. Advantageously, device 11 is soldered onto board 1043 and emulation is mediated by the device itself.

The few pins utilized by the scan interface 1150 eliminate the need for conventional full pin-out target connectors and eliminate problems associated with cable reliability, transmission effects and timing differences. In this way, board 1043 can be probed with logic analyzers and oscilloscopes in the improved system without physical or electromagnetic interference from a heavy cable. Moreover, clock rates in excess of 20 megahertz for device 11 are so fast that previous emulation schemes may be incapable of emulating it.

In FIG. 8, the on-chip emulation blocks are further illustrated wherein JTAG control is wrapped around the emulation according to MPSD (Modular Port Scan Design).

Principles of modular scan testing are also disclosed in coassigned U.S. Pat. No. 4,701,921 which is also incorporated herein by reference.

The JTAG control of FIG. 7 is indicated as JTAG control block 1201 of FIG. 8. Emulation control according to MPSD is provided as a block 1203. Test control block 1205 links JTAG to MPSD. Serial scan line 1207 enters the serial bit stream into any one or more of the selected areas of boundary scan area 1211 which includes BSR 1161 of FIG. 7 and scans the pin boundary of device 11. The FIG. 8 domains-CPU core domain 1213, system domain 1215 and analysis domain 1217 are shown in FIG. 7 and interface through the shift register latches of FIG. 4 to all of the various parts of the chip.

Figure 10:
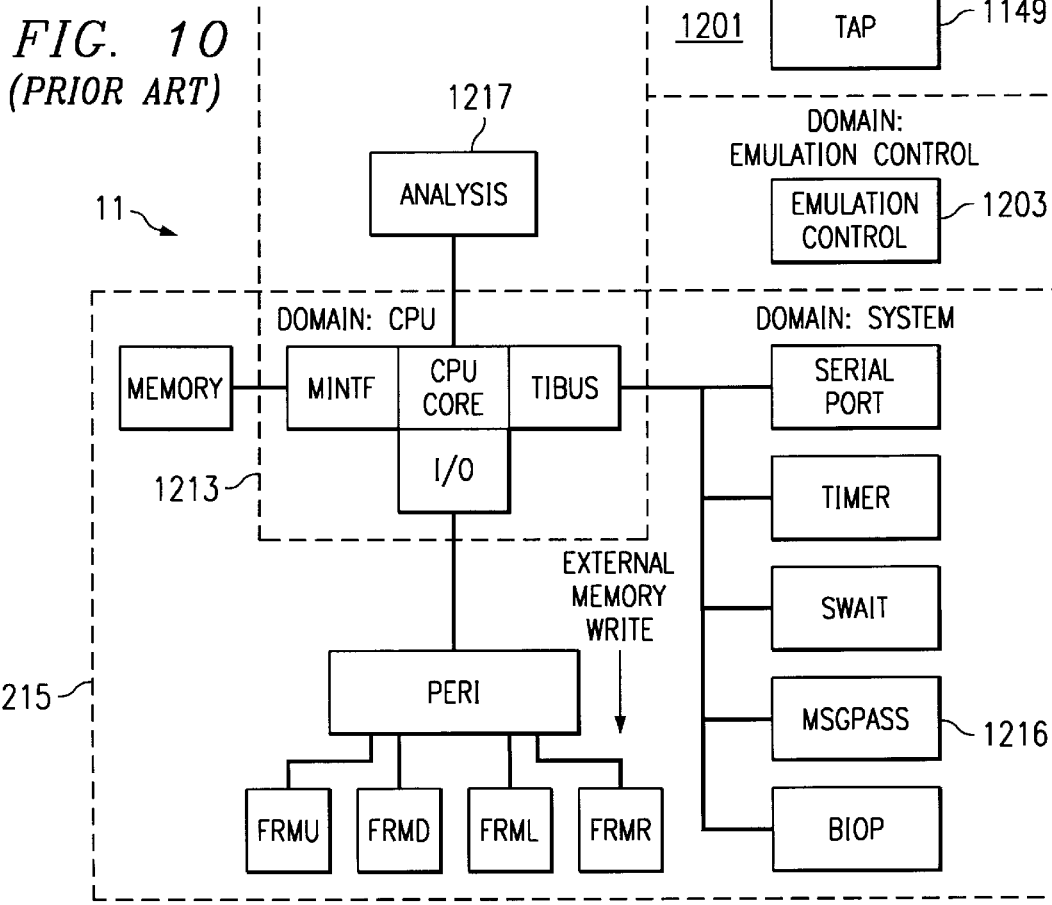
FIG. 10 is a block diagram of the processor chip of FIG. 9 showing functional blocks of the chip allocated to the various domains, and showing a message passing circuit.

FIG. 10 provides a further perspective of the domains of device 11. The CPU core domain 1213 includes the circuitry disclosed in U.S. Pat. No. 5,072,418. Analysis circuitry is connected to the CPU core as described more fully herein. The analysis circuitry includes condition sensors such as hardware breakpoint sensors for controlled stops and trace stack circuitry for real-time trace recordkeeping- The analysis circuitry is serial-scan accessible and designated the analysis domain 1217. All peripherals including memory and serial and parallel ports are denominated as the system domain 1215. For uniformity of description, JTAG control 1201 is regarded as a clock domain also in which test clock JCLK is active. Emulation control circuitry 1203 is a further domain of FIG. 10. Special message passing circuitry 1216 is also included in the system or analysis domain, to even more fully use the host computer 1101 as an attached processor by interfacing the TIBUS to the serial scan line 1103 of FIG. 2.

Figure 11:
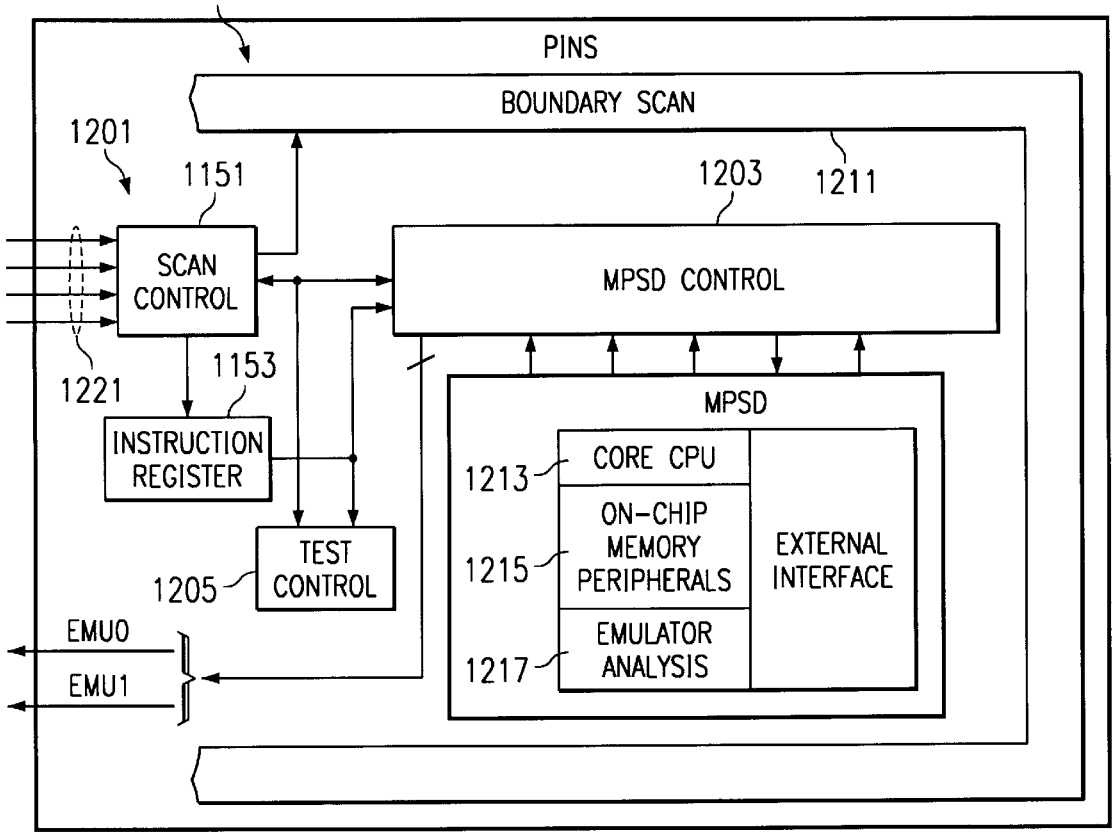
FIG. 11 is partially pictorial, partially block diagram of the processor chip of FIGS. 9 and 10.

FIG. 11 shows a physical perspective of the various domains on the chip of device 11. JTAG control 1201 interfaces with the pins via a serial boundary scan assembly including boundary scan register 1161 which allows all logic states at the actual pins of device 11 to be read or written. JTAG TAP controller 1151 and JTAG instruction register IR 1153 are provided on-chip. Test control 1205 and MPSD control 1203 are integrated into the circuitry. MPSD control 1203 serially interfaces with the domains for core 1213, system 1215 and analysis 1217 for the device 11. Bi-directional pins EMU0 and EMU1 are provided for external interfacing in addition to the four JTAG terminals 1221. Combining JTAG testability interface technology with MPSD modular port scan with the additional pins EMU0 and EMU1 synergistically opens up capabilities for integrating emulation, software development, and manufacturing and field test processes.

A medical analogy assists in describing the overall concept of this remarkable emulation feature. Device 11 is analogous to a human patient on a medical operating table wherein a dialysis machine and an electro-cardiogram are connected to different parts of the patient's body. While the patient's heart (functional clock FCLK) is pumping blood through the patient's torso and head (CPU core), the dialysis machine (test clock JCLK) is forcing blood through the vessels of the patient's legs (peripherals in system domain) in substantial isolation from the patient's heart. An electrocardiogram is attached to a separate part of the patient's body. All of these medical and physiological functions are operating at the same time so that the emergency medical needs of the patient are fulfilled in the shortest amount of time. Correspondingly, device 11 can have its own system clock FCLK running at full speed to run part of device 11 while another part of device 11 is operated by a different clocking system JCLK under the JTAG/MPSD control and then in a third feature, the JTAG control can be controlling the JTAG boundary scan. Moreover, the parts of each chip are selectively fed FCLK or JCLK upon command, affording a dynamic control process. In this way, the development requirements of the device 11 are fulfilled in an integrated manner in the shortest possible time.

In FIGS. 10 and 11, the development system capabilities for the preferred embodiments address applications development support in a fashion that allows the selection of a range of capability. Utilizing all of the disclosed development support hardware components provides development capabilities that include concurrency, ANALYSIS for on-chip breakpoint and trace, and realtime message passing MSGPAS8 between the emulation controller 1101 of FIG. 2 and the device 11 of FIG. 10. Various sections of the hardware support of FIG. 10 can be included or omitted in cost sensitive applications. For example, a basic system would support basic MPSD (Modular Port Scan Design) emulation or at the extreme, no emulation and only test with or without a boundary scan.

The total development systems advantages in the areas of emulation, simulation, and chip speed measurement interrelate with various test and functional features. The preferred embodiments have three architectures, a) functional architecture, (e.g., CPU memory and I/O), b) test architecture including JTAG and MPSD serial scan-based testability circuitry and c) emulation/support architecture such as message passing circuitry, simulation features, and boundary scan test. The three architectures advantageously minimize complication of the CPU, memory and I/O functional architecture and maximize the synergism with test.

Figure 9:
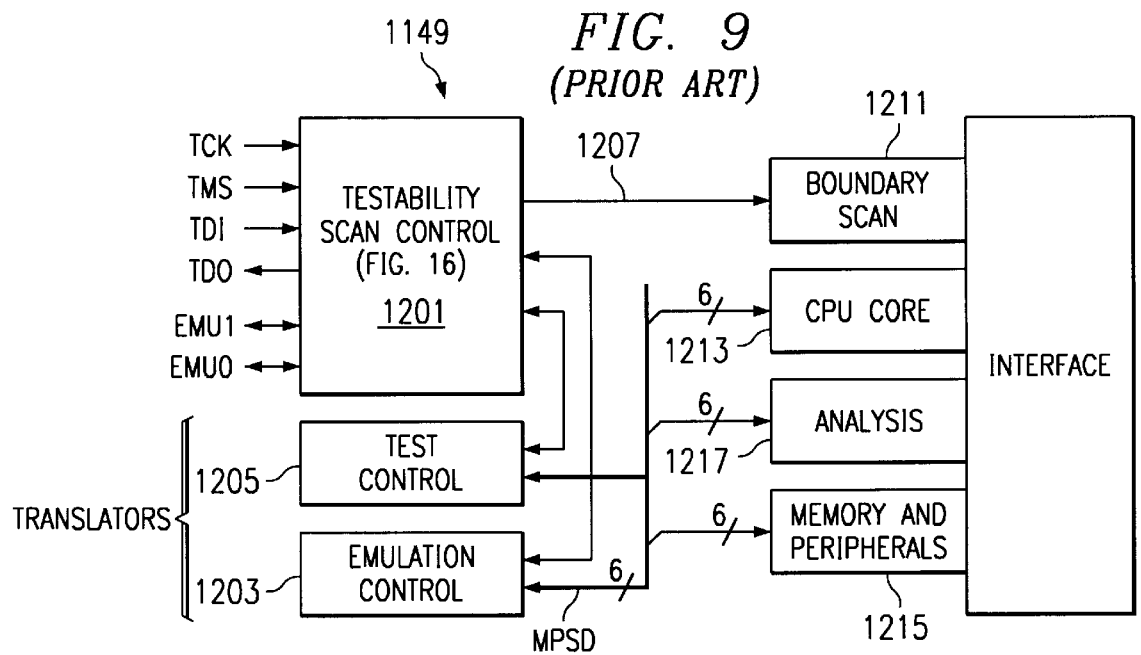
FIG. 9 is a block diagram of processor chip domains, boundary scan and scan test/emulation circuitry on chip.

The support architecture of FIGS. 9 and 10 provides means to match cost and capability requirements through the life cycle of the device 11. The support capability is delectable for devices created for some market segments. This partitioning does not affect the testability of the device by a test control 1205 of FIG. 9. In this way, a hierarchical scan architecture combines and improves a scan support/test front end with an MPSD interface as in FIG. 9.

The architecture of FIG. 9 provides uniform interfaces for boundary scan 1211, CPU core 1213, analysis 1217 and memory and peripherals 1215 which allow the selection of capability based on the choice of blocks 1215–1217 used.

Table II below describes the levels of capability created when additional hardware blocks are added to the CPU and system domains.

TABLE II

| JTAG CONTROL | TEST CONTROL | EMUL. CONTROL | ANALYSIS | MSG. PERIPHERAL |
|---|---|---|---|---|

MPSD Only
MPSD Test and Emulation

TABLE II-continued

| | JTAG CONTROL | TEST CONTROL | EMUL. CONTROL | ANALYSIS | MSG. PERIPHERAL |
|---|---|---|---|---|---|
| MPSD Test, Analysis, and Emulation | | | | X | |
| JTAG Device Test | X | X | | | |
| JTAG Emulation Concurrency | X | X | X | | |
| JTAG Emulation Concurrency with Analysis | X | X | X | X | |
| JTAG Emulation Concurrency, Analysis, Message Passing | X | X | X | X | X |

Referring to FIG. 10 and recapitulating, support architecture views the device 11 as the following five distinct clocking domains in order to control domain data transfers with the scan clock (JCLK) and application execution with the functional clock (FCLK).

1) CPU core domain 1213
2) Analysis domain 1217
3) Peripherals, memory, interfaces, and busing (system domain) 1215
4) Emulation control domain 1203
5) JTAG port and boundary scan domain 1201

There are two data path configurations, one for MPSD and one for JTAG. In the JTAG data paths of FIG. 7, data is scanned to and from the device 11 through internal scan paths that are selected through a JTAG instruction register 1153. A unique JTAG opcode for each path allows entry of and access to internal scan data.

The support architectures utilize two different clocks to support their operation. The two clocks are the functional clock (FCLK), and the scan clock (JCLK).

The emulation environment contemplates that some domains have a different clock source than others while test operation usually makes the device 11 fully synchronous and places all domains on the test clock JCLK. The clock separation provided by the domains of FIGS. 9 and 10 provides the ability to:

1) Connect all domains independently to either the JCLK or FCLK via the emulation control block 1203.
2) Apply test clock JCLK to all domains for test.
3) Run any domain with functional clock FCLK and then scan its contents with JCLK.
4) Halt the CPU domain with a stop response compatible with functional clock FCLK and then scan the CPU domain on test clock JCLK while the system domain of FIG. 10 continues to run on FCLK.

Clock domains of FIGS. 9 and 10 and the emulation control 1203 allow independent selection of functional clock FCLK (chip clock rate divided by two) or scan clock JCLK (TCK pin of FIG. 7). Each domain 1213, 1215, 1217 can have its clock individually selected while other domain selections are locked (unchanged). The selection process is a synchronized transfer of control between JCLK and FCLK in each domain. This transfer mechanism is located in the emulation control 1203 of FIGS. 6, 9 and 10 as discussed later hereinbelow.

Figure 12:
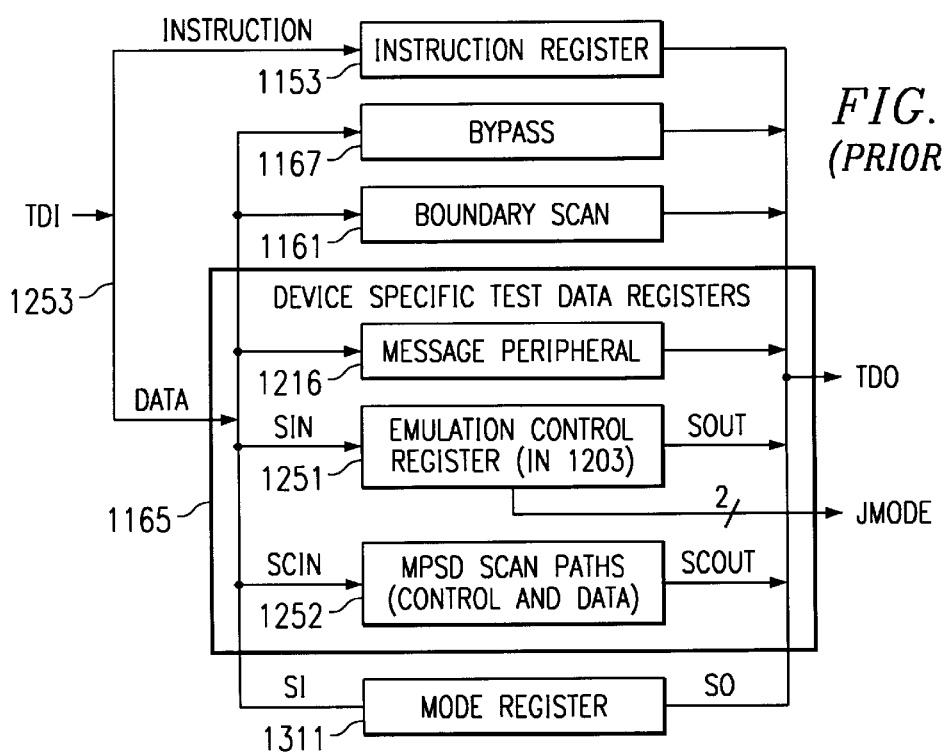
FIG. 12 is a block diagram of scan paths in greater detail than that of FIG. 7.

FIG. 12 shows a further diagrammatic perspective of the registers of FIG. 7 wherein JTAG instruction register IR 1153 is selected for scan between the terminals TDI and TDO. The IR 1153 is decoded in FIG. 7 to access the other serial shift registers or scan paths when requested by the control card 1141 of FIG. 2 via the serial line 1103. These shift registers are the bypass register 1167, the boundary scan register 1161, the message peripheral 1216 of FIG. 10, the emulation control register 1251 and a pair of MPSD scan paths 1252 in the various domains and modules in the domains.

Figure 13:
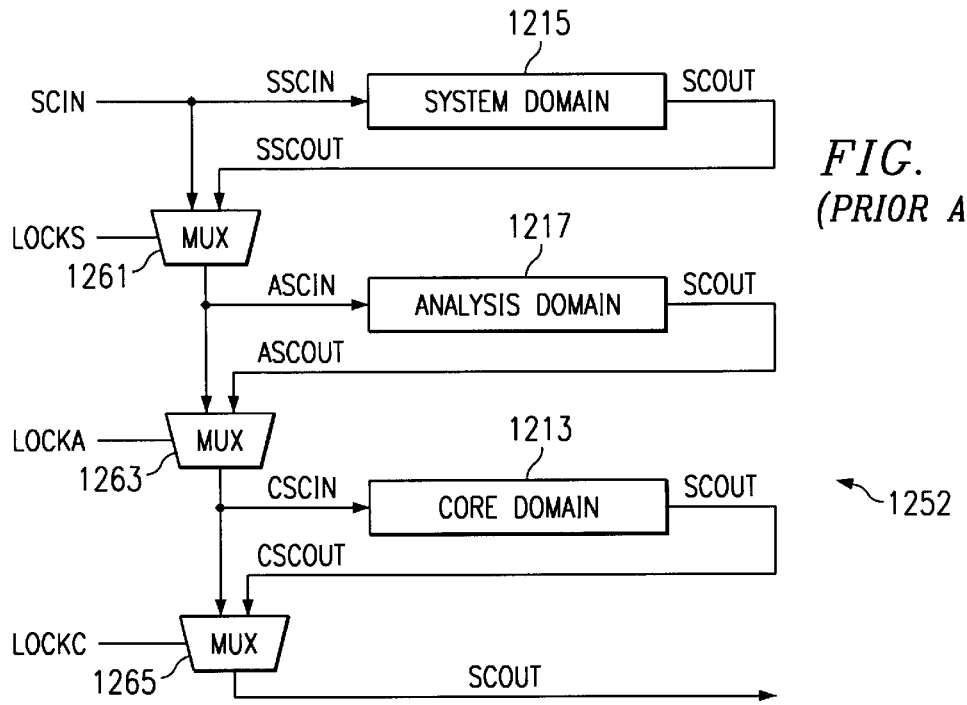
FIG. 13 is a block of scan paths in greater detail than that of FIG. 12.

In FIG. 13, a scan line 1253 from FIG. 12 is denominated SCIN and this line is selectively connected to three scan paths 1252 wherein each of the three paths is internally split by internal MUX selection into an internal scan control path and a scan data path. A set of external MUXes 1261, 1263 and 1265 are controlled by lock signals LOCKS (lock system domain), LOCKA (lock analysis domain), and LOCKC (lock core domain) from emulation control 1203 to bypass all but a selected one domain, if any, for scan and execution purposes. A locked domain has the MPSD codes (discussed hereinbelow) which have been supplied to that domain be frozen for the period the domain is locked. When any one domain (e.g. analysis domain) is to be scanned, its corresponding MUX 1263 deselects line ASCIN (analysis scan in data) and selects line ASCOUT (analysis scan out). In this way serial scan bits entering line SCIN enter analysis domain 1217 on line ASCIN, leave analysis domain via line ASCOUT, and bypass the other two domains. Each of the other two domains is selected analogously. Scan output exits through line SCOUT at the bottom of FIG. 13.

Figure 14:
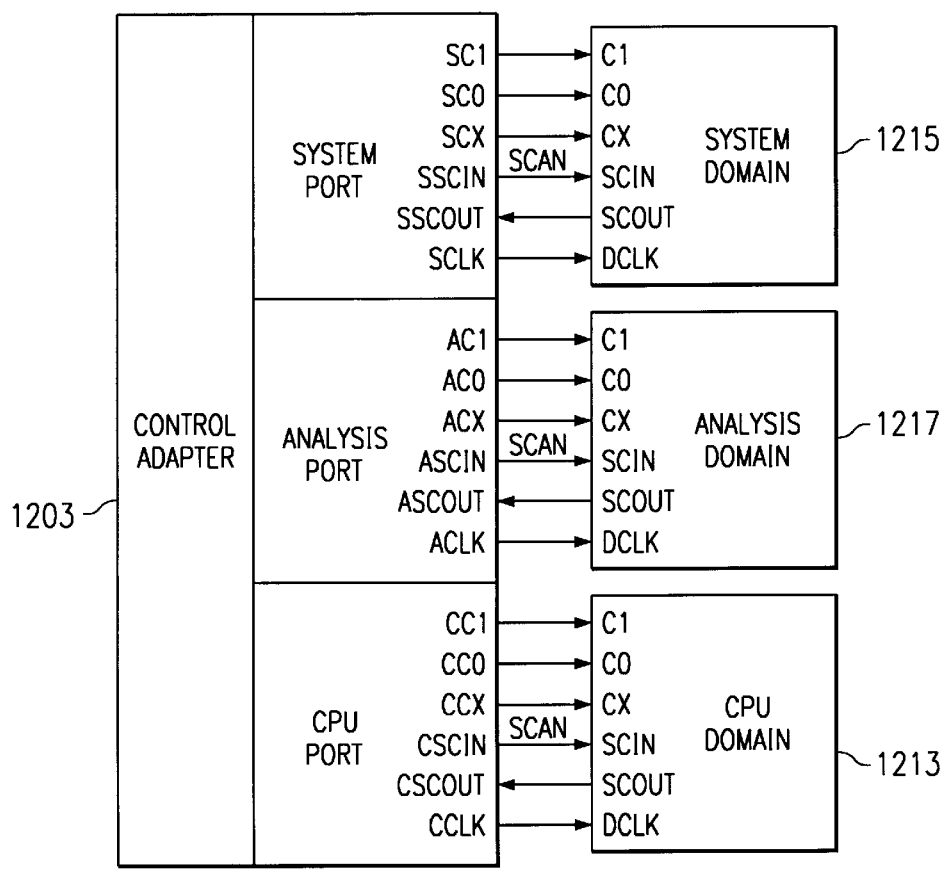
FIG. 14 is a block diagram of connections of a control adapter to the domains, showing nomenclature.

For each domain, MPSD command code bits C0, C1 and CX in FIG. 14 enter each domain from control adapter 1203. These MPSD command code bits C0, C1 and CX are parallel, not serial, and are distinct from scan control signals and scan data signals entering a line SCIN for each domain in FIGS. 13 and 14. Particular operations in particular modules in a given domain are determined by the scan control bits passed into the daisy chained modules of a given domain on line SCIN, when a particular code C1,C0=01 sets the internal selection to receive line SCIN scan bits into scan control bit SRLs in each module of the domain.

C is a one when not scanning and a zero when scanning. C0 and CX are sourced from the emulation control block adapter 1203 register 1251. When host computer 1101 detects Ready to Scan for all unlocked domains for a designated device on the Etarget board 1043, C1 and C0 are modified when in the Scan Data state JSDAT of FIG. 8 to make C1 and C0 both be zero (C1,C0=00) to set the internal selection to receive line SCIN scan bits into scan data bit SRLs in each module of a selected domain. When C1,C0=

01, then the internal selection is set to receive the SCIN scan bits into scan control SRLs as stated in the previous paragraph.

The command code lines C1,C0,CX, the scan in SCIN and scan out SCOUT lines, and clock lines are shown in FIG. 14. The scan control bits are scanned in on line SCIN to control and select one or more modules in a selected domain. Then scan data bits also on line SCIN are scanned into the selected domain into the selected one or more modules. Thus, the system affords individualized access of the MPSD scan data and scan control bits to the system domain 1215, analysis domain 1217 and CPU core domain 1213.

Identical nomenclature is applied to the domain inputs of FIG. 14 even though they are not connected together. Prefixes of S, A and C are applied to the nomenclature of the outputs of adapter 1203 that go to each of the domains. For example, AC1 is the C1 output for the A (Analysis) domain from the adapter 1203.

In the control 1203 clock switching circuits (1411, 1413, 1415 of FIG. 17) fed by FCLK and JCLK individually provide respective domain clocks to clock each of the domains separately or together as desired by the user. FIG. 14 also shows clock lines SCLK, ACLK, and CCLK going to domain clock inputs DCLK for system domain 1215, analysis domain 1217 and CPU domain 1213 respectively. Prefixes of S, A and C are denoted for the same lines at respective system, analysis, and CPU ports of adapter 1203 of FIG. 14.

The MPSD codes are tabulated in Table III:

TABLE III

| C1 | C0 | CX | SCIN | SCOUT | REMARKS |
|----|----|----|------|-------|---------|
| 1 | 1 | 1 | X | 1 | Functional run, emulation logic held reset (strap) (7) |
| 1 | 1 | 0 | X | 1 | Execute a command which has been scanned in: Emulation run, device running (6) |
| 1 | 1 | 0 | X | 1,0 | Emulation run, device halted on one-to-zero transition (6) |
| 1 | 0 | 1 | X | 1 | Halt applied, device still running. (5) |
| 1 | 0 | 1 | X | 1,0 | Halt applied, device halted on one-to-zero transition (5) |
| 1 | 0 | 0 | X | Do | Scan pause (4) (Cause serial data transfer to pause) |
| 0 | 1 | X | Di | Do | Scan control path data (2,3) |
| 0 | 0 | X | Di | Do | Scan data path data (0,1) |

Since there are two different MPSD scan paths in each module (FIGS. 4 and 5 being simplified suggest both paths with only one serpentine loop), the C1,C0 codes act as a selection code. C1,C0=01 selects the control path, whence control bits are scanned in on line SCIN and control information scanned out on SCOUT. C1,C0=00 selects the data path, whence data bits are scanned in on line SCIN (FIG. 13) and data developed in device 11 scanned out on SCOUT.

When C1=1 (command code C1 active), then control line CX is available for defining further codes for a whole domain as tabulated above.

The scan out line SCOUT has a dual function. In a first function SCOUT serves as a handshake or interrupt by representing whether the device is running or halted in response to the command entries 7, 6 and 5. In the second function, it serves as a line for scanning out serial data in the last two tabulated codes. Transitions from shift operations (0,1,2,3) to execute operations (5,6,7) or from execute to shift, preferably include a pause (4) to halt (5) or halt-to-pause sequence. This is not mandatory, but can be used to effect orderly behavior of device 11 internal buses and state machines in such transitions.

It is of interest that Pause state 100 electrically borders both the command codes above it (herein called Execute codes) in the table as well as the command codes to scan (herein called Scan codes), below it.

Figure 15:
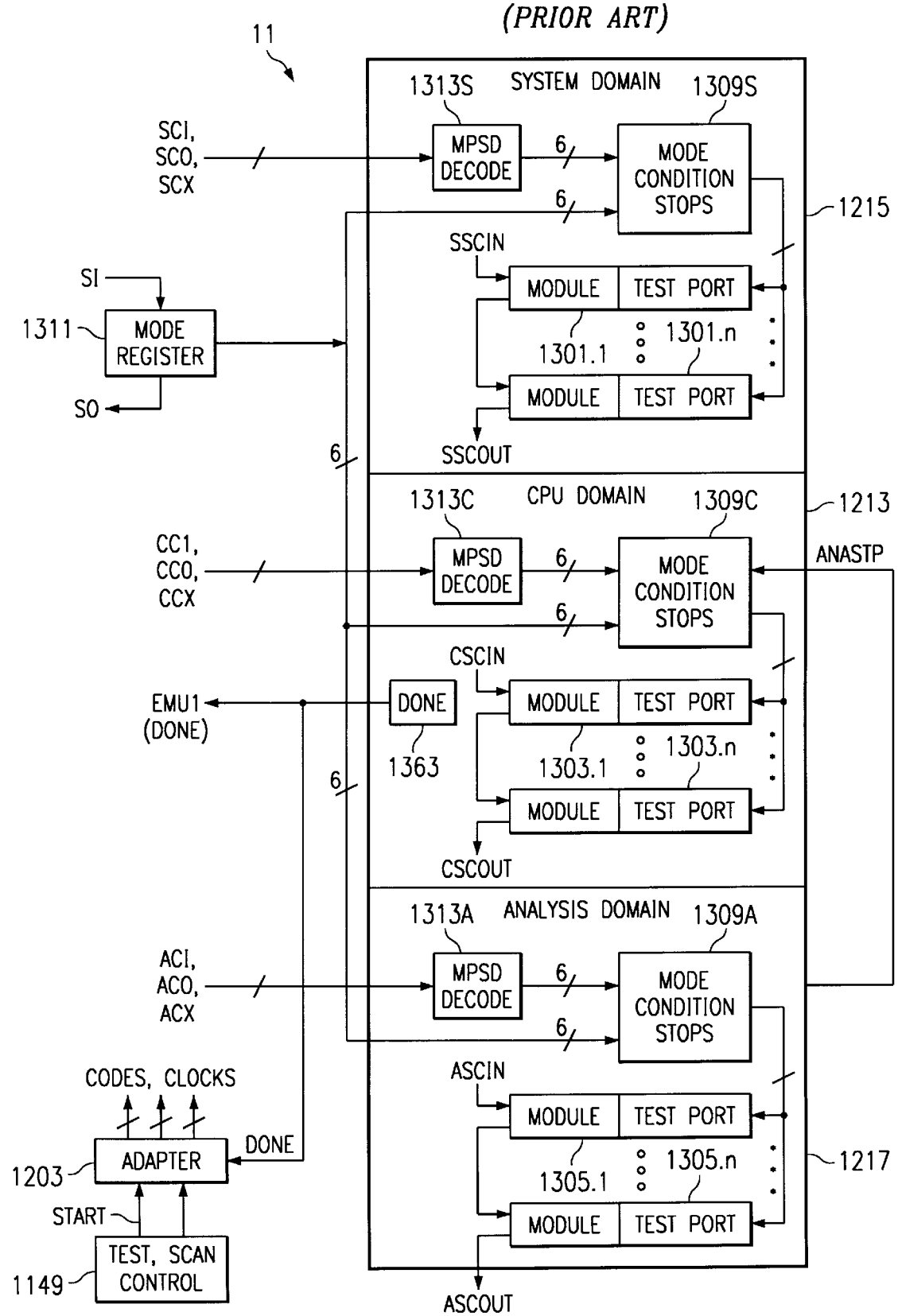
FIG. 15 is a block diagram of modules in the domains, also illustrating a mode-driven stops process.

In FIG. 15, the adapter or emulation control block 1203 is used to independently manage the clock signals that it routes to the CPU, analysis, and system domains. 1213, 1217 and 1215 respectively. Block 1203 also applies a sequence of the command code triplets (C0, C1, CX) to generate emulation and simulation functions. Each domain has modules, such as 1301.1 and 1301.n in system domain 1215, 1303.1 and 1303.n in CPU core domain 1213, and 1305.1 and 1305.n in analysis domain 1217. Associated with each module is a test port as described in application Ser. No. 057,078 issued May 22, 1989 (U.S. Pat. No. 4,860,290).

Connected to each test port is mode conditioned stop logic circuitry 13098, 1309C and 1309A in the domains respectively. The modes are established by a mode register 1311 which is scanable in FIGS. 12 and 15 to establish the type of stop and any other desired mode characteristics for the domains. The mode conditioned stop logic circuits 13098, 1309C and 1309A are respectively fed by MPBD decoders 1313B, 1313C and 1313A that have multiline outputs to the stop mode conditioned logic circuitry.

Scan control 1149 scans in an initial state (test vector) into the registers of device 11 to set up a test or emulation sequence. This is done with all domains locked, meaning that test clock JCLK is applied for scan purposes. When all data and control registers are loaded, circuitry 1149 sends a START signal to adapter 203. The CPU domain, for an example, is unlocked, meaning that it is started running on functional clock FCLK.

Then in a stop feature, the analysis domain 1217 is scan programmable to direct the CPU domain to stop on a predetermined condition. When the predetermined condition occurs, a signal ANASTP (Analysis Stop) is sent to the CPU domain 1213 to make it stop according to the stop mode established for it in mode register 1311 and mode conditioned stop circuitry 1309C. DONE circuitry 1363 detects when the stop is completed and signals back to adapter (emulation mode control) 1203 to lock the CPU, for example, by putting it on test clock JCLK instead of functional clock FCLK. The DONE signal is generated when all instructions in a CPU pipeline are executed and all currently pending memory access cycles are completed. Another definition of DONE may of course be used or mode-selected. Then using test clock JCLK, the important registers of the domains can be scanned out for recordkeeping, display and study at host computer 1101 of FIG. 1.

Figure 16:
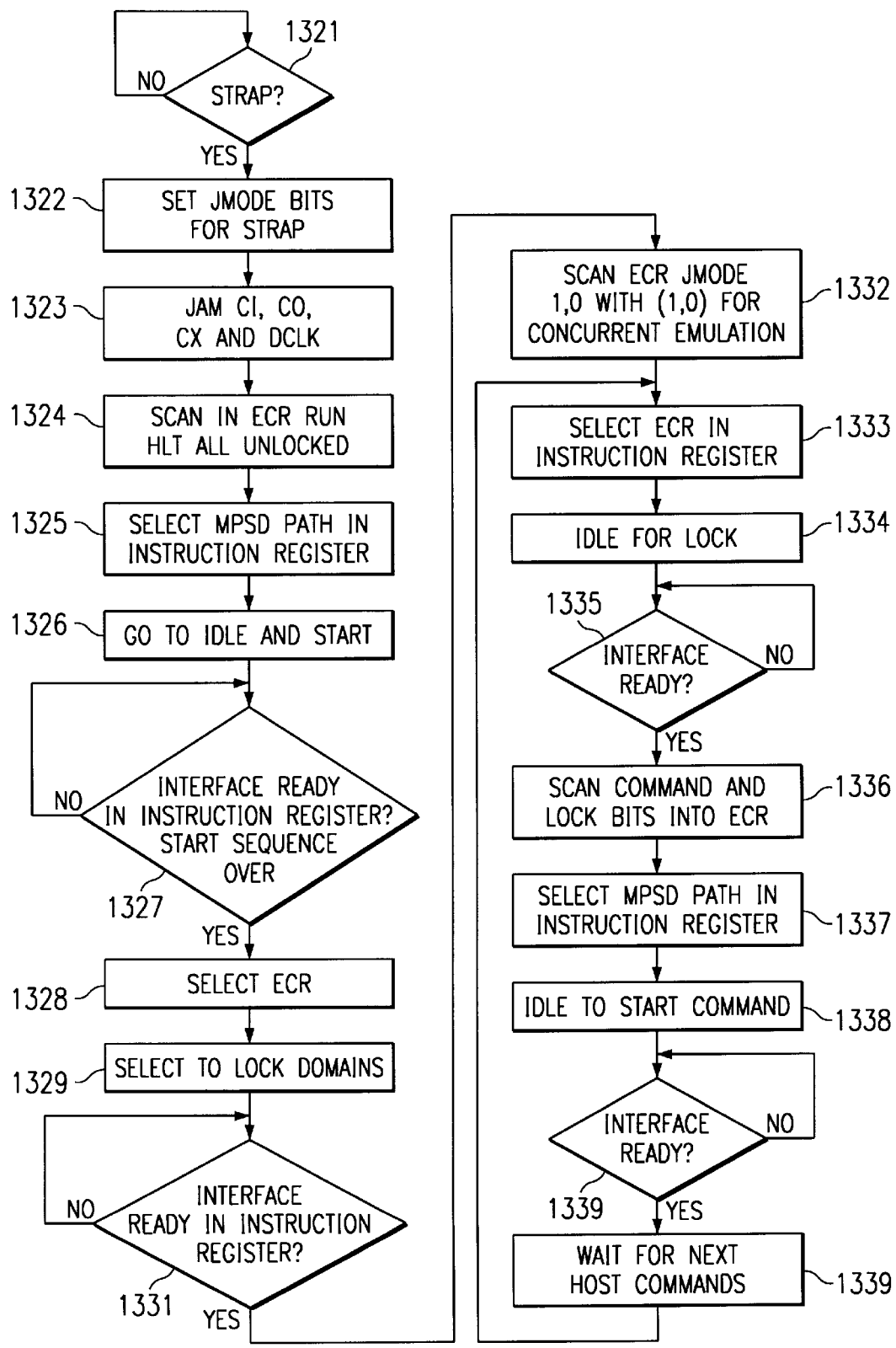
FIG. 16 is a process diagram of operation of the system of FIGS. 2, 7, 15 and 17 for emulation, simulation and testability.

FIG. 16 illustrates in even further detail an example of process steps by which the scan control 1149 including IR 1153, adapter 1203 including ECR (emulation control register) 1251, and host computer 1101 cooperate to enter and perform sequences of commands on-chip.

Operations in FIG. 16 commence in a step 1321 with a reset STRAP state of FIG. 8 in the scan control 1149 in FIG. 7. Output JSTRAP of TAP controller 1151 of FIG. 7 becomes active and in a step 1322 sets two JMODE bits in ECR 1251 of FIGS. 12 and 17. Adapter 1203 jams a functional 111 command code and sets the domain clocks in a step 1323.

Next in a step 1324, the host 1101 sends TMS signals to scan control 1149 to reach the FIG. 8 TAP controller state "Select-IR-Scan" and then scans ECR select into the IR 1153. Further in step 1324 the host sends more TM8 signals to the TAP controller to reach the state "Select-DR-Scan". This means that the scan controller is ready to accept scan into a DR (data register) identified just before as the ECR 1251 by the host to the IR 1153. Into ECR 1251 the host 1101 then scans two-bit portions C0,CX of the triplets for RUN and HALT of Table III. Lock bits are also loaded to unlock all of the domains. The lock bits are scanned for this purpose into a FIG. 17 ECR 1251 portion called LOCK 1351.

In a succeeding step 1325, host computer 1101 sends TM8 signals to the scan control 1149 to reach the TAP controller state "Select-IR-Scan" again. This time the host then scans MPSD path 1252 select into the IR. In a step 1326, more host TM8 signals are sent to reach the state IDLE in FIG. 8. Hardware in FIG. 7 thereupon produces the signal START to activate the code state machine 1381 in the adapter 1203. A decision step 1327 determines whether the scan interface 1149, 1203 is ready. When ready, the host 1101 scans an ECR select into the IR 1153 in a step 1328, followed by more TM8 to reach the IDLE state in a step 1329. This deactivates the start signal and permits scan-out of domain information by DR scan from the MPSD path 1252 in steps which are omitted for conciseness from FIG. 16.

When the interface is again ready in a step 1331 operations proceed to a step 1332 and a step 1333 to select and scan the ECR 1251 JMODE bits JMODE1 and JMODE0 with logic I and logic zero respectively to enable concurrent emulation. Then in a step 1334 the host 1101 sends TMS signals to reach the IDLE state of FIG. 8 for lock. When the interface is ready after a step 1335, the host 1101 scans command and lock bits into ECR 1251 in a step 1336. Next in a step 1337, the host 1101 sends TMS to select scan to the IR, scans a MPSD path select into the IR. Next in a step 1338, the host 1101 sends more TMS to reach the IDLE state of FIG. 8 whereupon hardware of FIG. 7 initiates the START signal to the adapter 1203 code state machine 1381. A step 1339 has the host wait until the interface is ready, whereupon operations loop back to step 1333 to have the host 1101 scan further commands into the ECR and then start the on-chip emulation circuitry to run the chip in real-time.

It is to be understood that the description of steps is by way of example only. Data and control information are scanned into and out of the domains on test clock JCLK, and the domains are independently and selectively started on functional clock FCLK and stopped, in extensive sequences to accomplish emulation, simulation and test functions with a wide degree of flexibility as circumstances of the development, manufacturing and field environments dictate.

This remarkable capability of scanning in emulation data and retrieving it from each domain, and further of individually clocking the domains with either the real time functional clock FCLK or a test clock JCLK is mediated by the emulation control 1203 in response to the host computer 1101 and improved JTAG circuitry of FIG. 7. The emulation control 1203 is illustrated in greater detail in FIG. 17.

Figure 18:
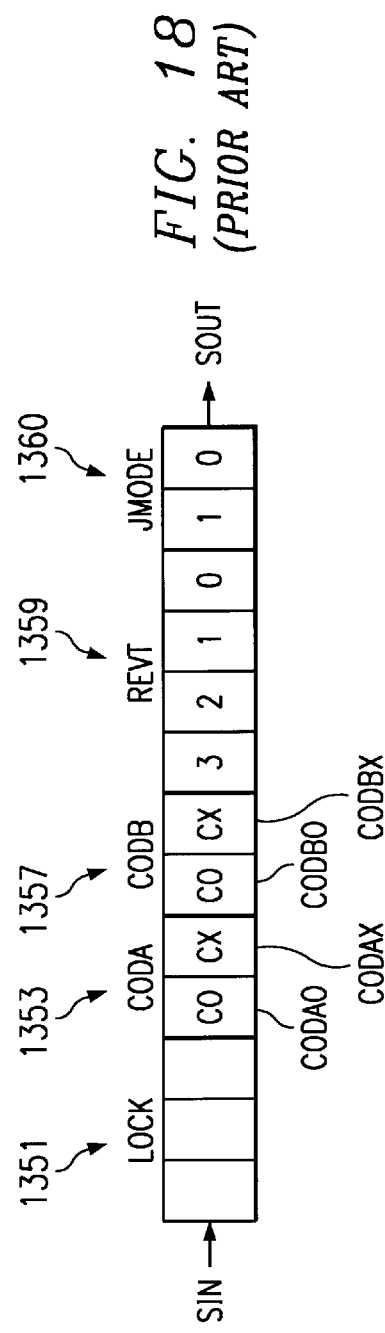
FIG. 18 is a compact diagram of shift register latches SRLs in a scan chain in FIG. 17.
Figure 17:
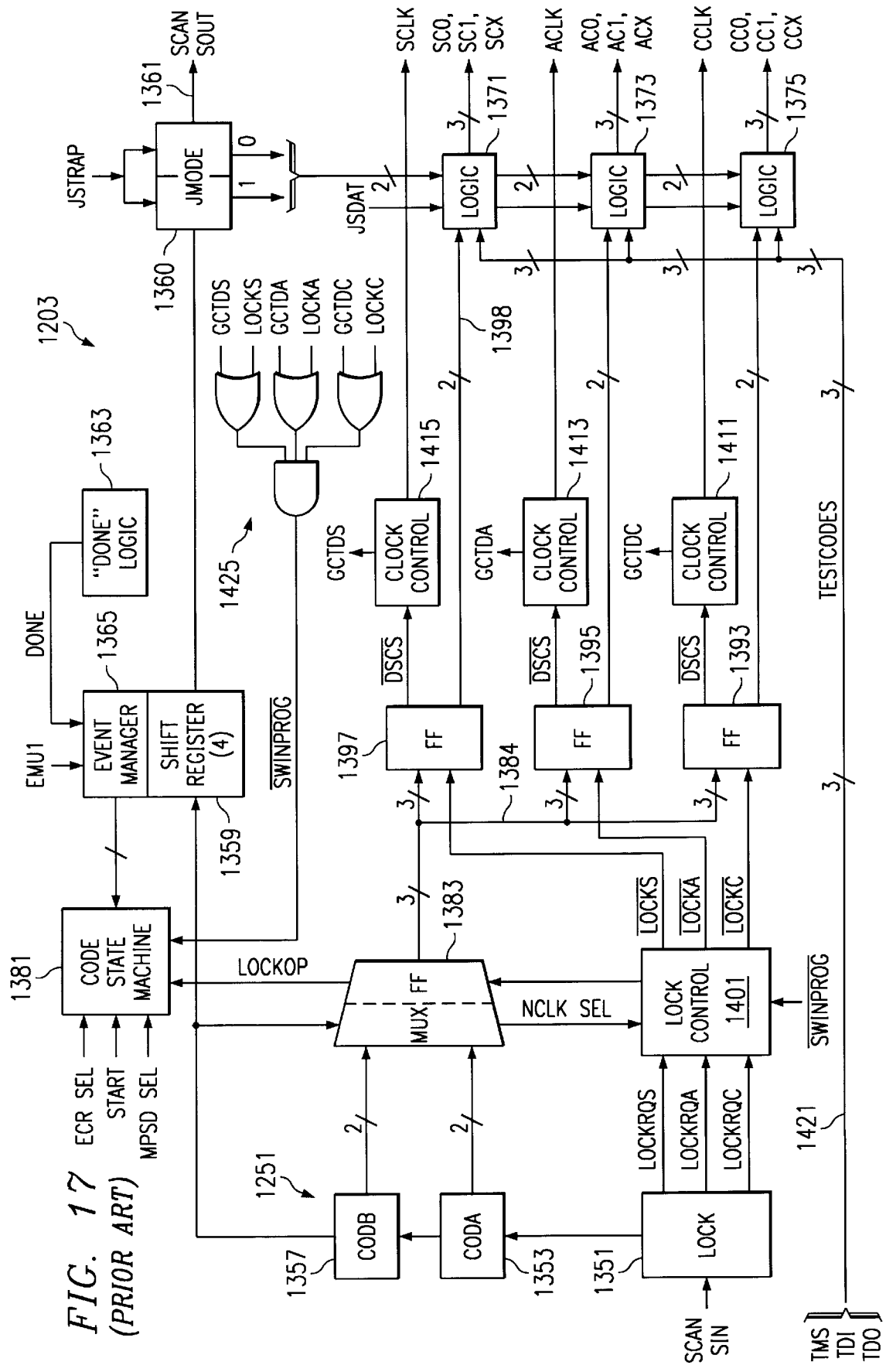
FIG. 17 is a detailed block diagram of the adapter of FIGS. 6, 9, 10, 11, 12 and 15.

In FIG. 17, serial scan bits enter the emulation control register ECR 1251 which is subdivided into a shift register LOCK 1351 for holding bits to lock and unlock domains, a first C0,CX control code shift register named CODA 1353, a second C0,CX control code shift register named CODB 1357, a shift register 1359 associated with event manager circuitry 1365, and a two-bit register JMODE 1360. These registers are compactly illustrated in FIG. 18. Thus, the serial scan enters on a scan line SIN, passes serially through the shift registers 1351, 1353, 1357, 1359 and 1360 until all the shift registers are loaded. Any serial scan output is scanned out via serial line 1361 SCUT.

A set of selector logic circuits 1371, 1373 and 1375 of FIG. 17 supply signals on lines as shown in FIG. 14 to the domains for the core 1213, system 1215 and analysis 1217. Also, individualized domain clock lines DCLK of FIG. 14 are supplied respectively with clock signals SCLK, ACLK and CCLK in FIG. 17.

A code state machine 1381 controls a two input MUX 1383. MUX 1383 selects the C0,CX two-bit contents of shift register 1353 or 1357 and loads them into an enabled one of three flip flops 1393, 1395 and 1397. A lock control circuit 1401 operating under the control of lock shift register 1351 and code state machine 1381 sends lock signals to disable or enable each of the flip flops 1393, 1395 and 1397, depending on which selected domain 1213, 1215 or 1217 is to be unlocked while other domains are locked.

Each flip flop has three sections for C0, CX and a clock control signal DSCS-.

Three clock control signals, each independent of the others and all designated DSCS-, are supplied from the flip flops 1393, 1395 and 1397 to respective clock control circuits 1411, 1413 and 1415 which provide the individualized domain clock outputs-core clock CCLK, analysis clock ACLK and system clock SCLK.

Test codes from the TMS, TDI and TD0 lines from host 1101 enter FIG. 17 on three lines 1421 to selection logic 1371, 1373 and 1375. Command codes for each domain can be derived directly from the test codes on line 1421, thus overriding the code state machine feature. This option is selected by scanning JMODE register with "00", (both bits zero). Thus, the preferred embodiment is accommodates direct host control of the domains, wherein the latter is the JMODE 00 option.

If a switch of any domain 1213, 1215, 1217 between JCLK and FCLK is in progress under control of any of the clock controls 1411, 1413, 1415, then code state machine 1381 should be temporarily stopped. This is accomplished by a disabling input low active SWINPROG-(Switch In Progress) which is fed from a logic network 1425 in response to the LOCKC, LOCKA and LOCKS inputs from lock control 1401 and from three clock domain signals GCTDC, GCTDA and GCTDS. The latter three signals signify Good Clock This Domain for each of the domains-Core, Analysis and System, respectively.

In FIG. 17, the control block 1203 functions are programmable and allow one to:

1) Apply MPSD codes from one of two preloaded registers, CODA 1353, and CODB 1357 as directed by a code state machine 1381;
2) Program state machine 1381 operations via REVT (Register Event) register 1359 to respond to stimuli including:
   a) START from scan control 1149
   b) DONE from CPU core 1213, 1363
3) Control the clock switching from FCLK to JCLK (with a code 00 in both registers 1353 and 1357) and vice versa for each domain, via LOCK register 1351; and
4) Lock domains in their current state while operating with other domains.

The control block 1203 allows the following clocking options:

a) The orderly switch of the domain clock lines between JCLK and FCLK clock pulse sources.
b) Domain clock lines may be locked in the current state by lock bits on a scan data path.

c) The JTAG strap (reset) state or MPSD strap state cause the functional clock to be selected.

d) Test mode selection allows the entire chip to be driven by JCLK.

This clocking selectability allows configuration of a fully synchronous chip for test, and the ability to scan any one or more of the domains, or the whole chip with data transfers being synchronous to the JCLK.

The operation of code state machine 1381 is now further described. When the JTAG IR (Instruction Register 1153) is loaded with a scan path select command for path 1251, a line ECRSEL feeds a signal to state machine 1381 whereupon the state machine 1381 enters a lock state. This allows the registers 1351, 1353 and 1357, the event manager register 1359, and JMODE register 1360 to be changed without disturbing the MPSD codes and clocks supplied from flip flops 1393, 1395, 1397 and selection circuits 1371, 1373 and 1375 to the domains 1215, 1213 and 1217. Lock register LOCK 1351 holds bits which selectively cause the CPU, analysis and system domains 1213, 1217 and 1215 to be frozen in their current configuration and state in response to MPSD command codes presently applied to them from flip-flops 1393, 1395, 1397 and logic 1371, 1373 and 1375.

The START signal for state machine 1381 of FIG. 17 is generated in the circuit of FIG. 7 when a scan data path select signal is present and TAP controller 1151 reaches the JTAG IDLE state of FIG. 8. The JTAG interface of FIG. 7 becomes passive and the dynamic operations of circuit 1203 of FIG. 17 commence.

In FIG. 7 the START signal is generated as follows. A path decoder 1168 connected to instruction decoder 1155 qualifies AND gate 1170 when its OR gate 1172 signals that the MPSD scan data path 1252 of FIG. 12 or MPSD scan control path are selected. An IDLE line from TAP controller 1151 is connected to another input of AND gate 1170. When the IDLE state occurs with gate 1170 qualified for path, AND gate 1170 signals a handshake synchronizer 1169 to supply START to code state machine 1381 of FIG. 17.

Handshake synchronizer 1169 is provided because emulation control 1203 is operated on pulses of functional clock FCLK at times while the JTAG circuitry operates on the test clock JCLK. Handshake synchronizer 1169 includes two state machines to control the generation of the START signal to the code state machine 1381. One state machine is in the JTAG environment of FIG. 7 and the other is in the MPSD control environment of FIG. 17. In this way, the clock boundary is crossed.

The emulation control block 1203 of FIG. 17 serves to create MPSD control codes for the MPSD domains 1213, 1215 and 1217 which perform the necessary emulation, simulation and test functions. A general programmable implementation is illustrated, although a fixed hard coded implementation is also feasible. Moreover, a microcoded control ROM (CROM) implementation of the circuitry of FIGS. 7, 9, 15 and 17 is an alternative embodiment contemplated in the practice of the invention.

The code state machine 1381 controls the generation of MPSD code sequences to the domains. The clock control circuits 1411, 1413, and 1415 each include a state machine that controls the switching of the clocks of the domains between JCLK and FCLK in an orderly way before allowing a new MPSD code (C0, C1, CX) to be applied to the domains. "State Machine" is used in the computer science sense of the phrase to denote any software or hardware based circuit that is represented by a state transition diagram that has at least two states. This state machine approach minimizes the number of JTAG opcodes assigned to emulation functions as well as greatly simplifying the MPSD interface.

From one perspective, the Pause command code (C1,C0, CX=100) of Table III is a default state or "anchor" to which the other states relate. The code state machine and registers CODA and CODB operate with their C0,CX contents to alter the Pause state to HALT (101), CNTRL (110) or FUNC (111) of Table III. When a scan into a domain is desired, the code state machine 1381 is directed by host 1101 software to enter C0,CX=00 in both CODA and CODB, and in this way a Pause (100) is applied to the device 11.

From a clock switching point of view, a transition from HALT 101 to Pause 100 causes a functional clock FCLK to JCLK test clock switch-over. The switch-over occurs in the Pause state applied to the domain inputs C1,C0,CX by the logic 1371, 1373 and 1375.

A transition from Pause 100 to any of FUNC 111, CNTRL 110 or HALT 101 causes the interface to freeze in Pause 100 until all unlocked domains switch to functional clock FCLK and thereupon operate on FCLK. Thus all clock switching occurs with the 100 Pause code applied.

Figure 19:
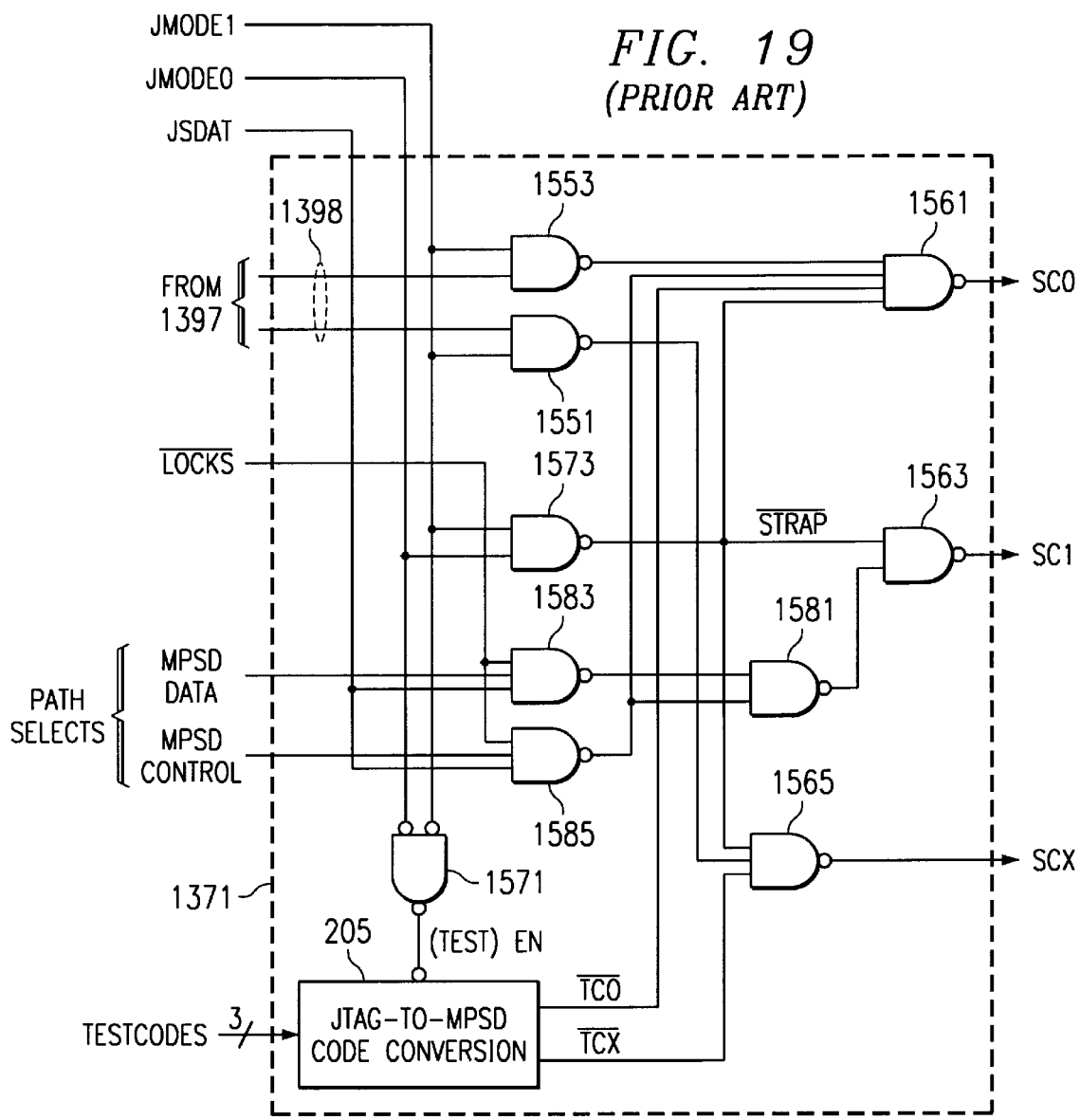
FIG. 19 is a schematic diagram of one of three identical logic circuits of the adapter of FIG. 17 supplying codes to a domain.

The host 1101 software is programmed to operate this interface, for example, on the assumption that when the Pause (100) code is present on all unlocked domains, and it may now load the MPSD path select into the IR 1153 and then scan MPSD data or control bits into a selected domains. The logic 1371, 1373 and 1375 of FIG. 19 responds to the path select as data control to set a ScanData (00x) or Scan Control (01x) MPSD command code for the domains.

A Scan Ready SCANRDY interface-ready bit can be set in IR 1153 for use by host 1101 software to signify that all domains unlocked have no switch in progress and Pause 100 is applied to them, so that it is all right to scan data or control bits into the domains.

Since the logic 1371, 1373 and 1375 responds to the path selects when scan codes 00x or 01x are needed, it should be apparent that the code state machine 1381 and registers CODA and CODX job primarily involves delivering code bits C0,CX from among the group 00 Ready to Scan, 01 Apply HALT, 10 Apply CNTRL and 11 Apply FUNC. Code bit C1 of Table III is a one (1) due to host 1101 software not attempting to scan while the state machine is applying a code C0,CX of 01, 10 or 11. Thus, the MPSD command codes C1,C0,CX are respectively constructed-101 HALT, 110 CNTRL and 111 FUNC.

Figure 20:
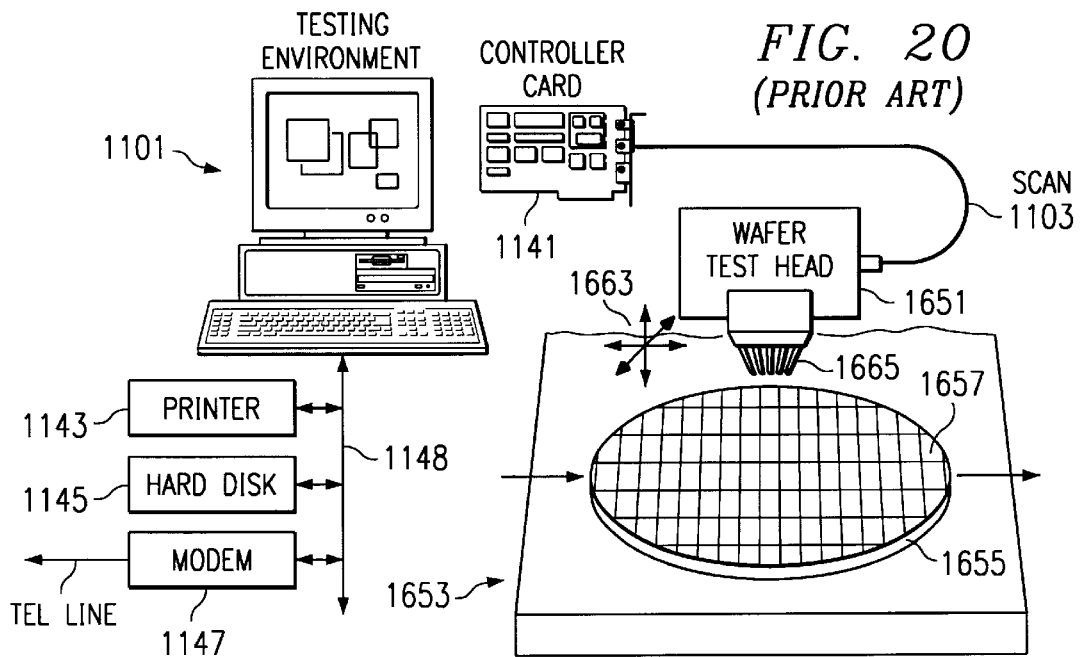
FIG. 20 is a pictorial diagram of a testing system for testing numerous integrated circuits on a wafer in wafer fabrication.

Moreover, as illustrated in FIG. 20, tests are downloaded in the chip manufacturing process itself. The host computer 1101 is advantageously coupled to a test head 1651 of a wafer fabrication line 1653 to detect device defects on each wafer 1655 before the wafer is divided into chips or at any point in manufacturing. A scan interface as described in connection with FIGS. 6, 12, 13, 14, 15 and 17 is microscopically provided in each of numerous locations 1657 on the wafer from which many chips are derived respectively.

The host computer 1101 in FIG. 20 is loaded with a testing program and communicates via controller card 1141 and serial line 1103 to a wafer test head 1651. Test head 1661 is precisely positioned in X,Y,Z coordinates 1663 to reliably press contact wires 1665 against microscopic contact pads for each die location 1657 in the wafer 1655. The circuit at location 1657 is the circuit of device 11 for example. A full complement of peripheral resources is available to computer 1101 and device on the wafer, in the form of printer 1143, hard disk 1145, and modem 1147 on bus 1148.

According to a process illustrated in FIG. 21 operations start with wafer fabrication 1671 and then in a step 1673 the wafer 1655 is conveyed to the test position shown in FIG. 20. Then a step 1675 positions test head 1651 in XYZ coordinates 1663 to contact the next chip on the wafer 1655 with test head 1651. A succeeding step 1677 downloads scan-self-test patterns to RAM in the chip via test head 1651. The chip is switched to functional clock to execute the test patterns on-chip in step 1679. Then the device state of the chip is scanned out through the microscopic interface having circuits 1150 and 1203 of FIG. 6 at location 1657 in step 1681. The signals pass through test head 1651 to host computer 1101 for processing and data storage and display in the peripheral resources. In step 1683, host computer 1101 determines whether the chip at location 1657 is defective. If defective, a step 1685 branches to an action step 1687 to optionally dot-mark the wafer location and/or to store data on it to keep a record of the defect which may also be useful for microscopic repairs of the circuit. Then in a step 1689, if all chip locations are not yet tested, operations loop back to step 1675 to precisely position the contacts 1665 of test head 1651 against the next chip location to be tested on wafer 1655. If all locations are tested, operations branch from step 1689 to a decision step 1691. If a next wafer is to be tested, operations loop back to step 1673 to convey another wafer to test position, otherwise the process comes to END 1693.

In device 11, the core CPU implements the following capabilities:

Strap functional when directed from the scan interface.

Run and halt when directed from the scan interface.

Halt when either a software breakpoint or a hardware breakpoint is encountered.

Select the core clock to be a scan clock and prepare to scan.

Assert a suspend signal to the remainder of the chip in order to direct peripheral start/stop features.

Keep a clear record to indicate the reason that the device halted.

Manage interrupt occurrences.

Provide pipeline management for breakpoint and software interrupt occurrences when they interact with delayed branches and other pipeline-relevant occurrences.

Instruction step such as executing the interrupt service routine one instruction at a time if an interrupt occurs.

Generate memory accesses from CPU core while the core is halted.

Program counter stack traces a number of preceding program discontinuities.

Read and write to memory while the CPU core is executing code; communicating with a debug monitor or SPOX debugger resident on the chip or in memory.

Figure 22A:
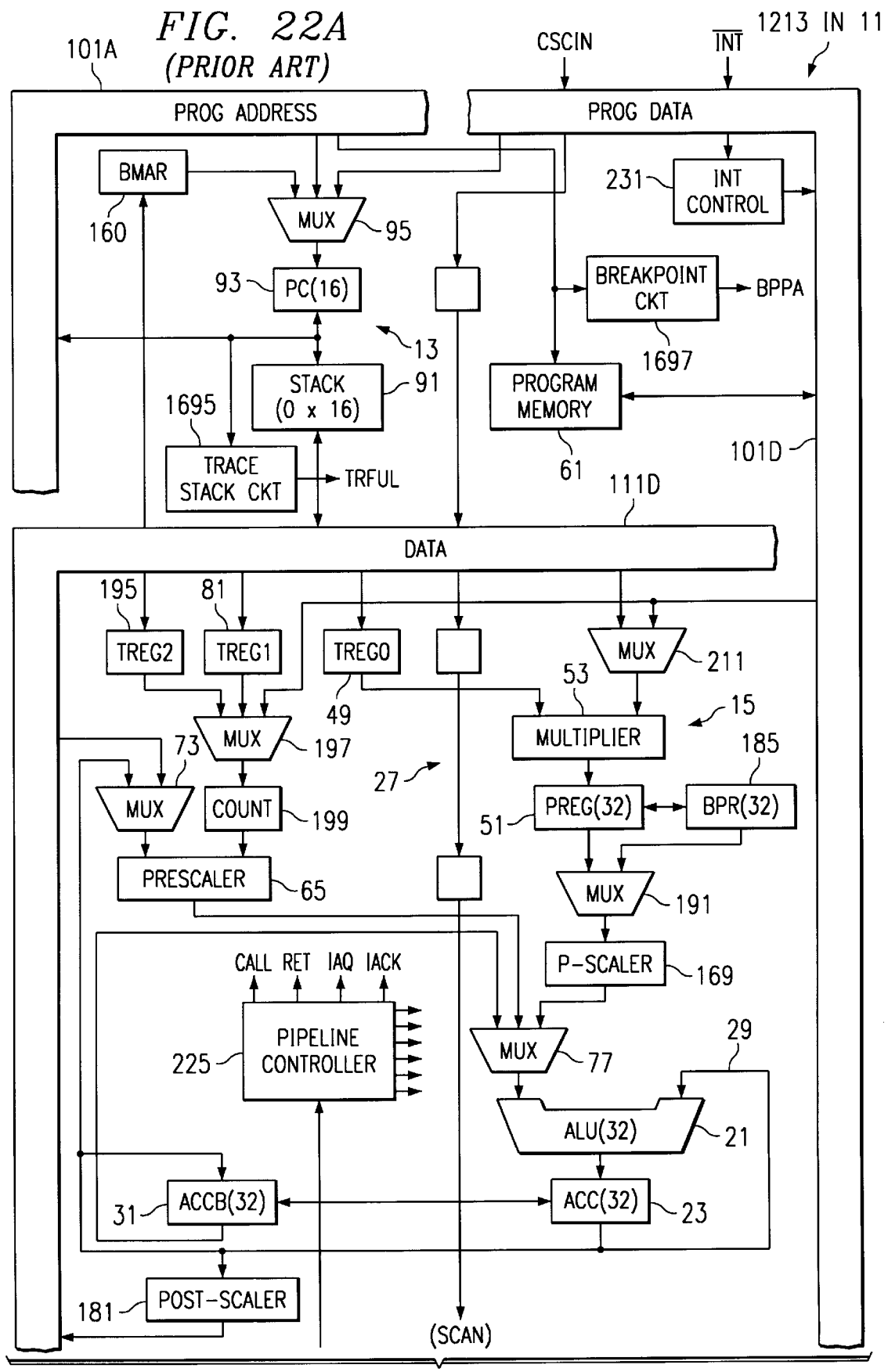
FIGS. 22A and 22B are two halves of a block diagram of a central processing unit CPU core improved for emulation, simulation and testability.
Figure 22B:
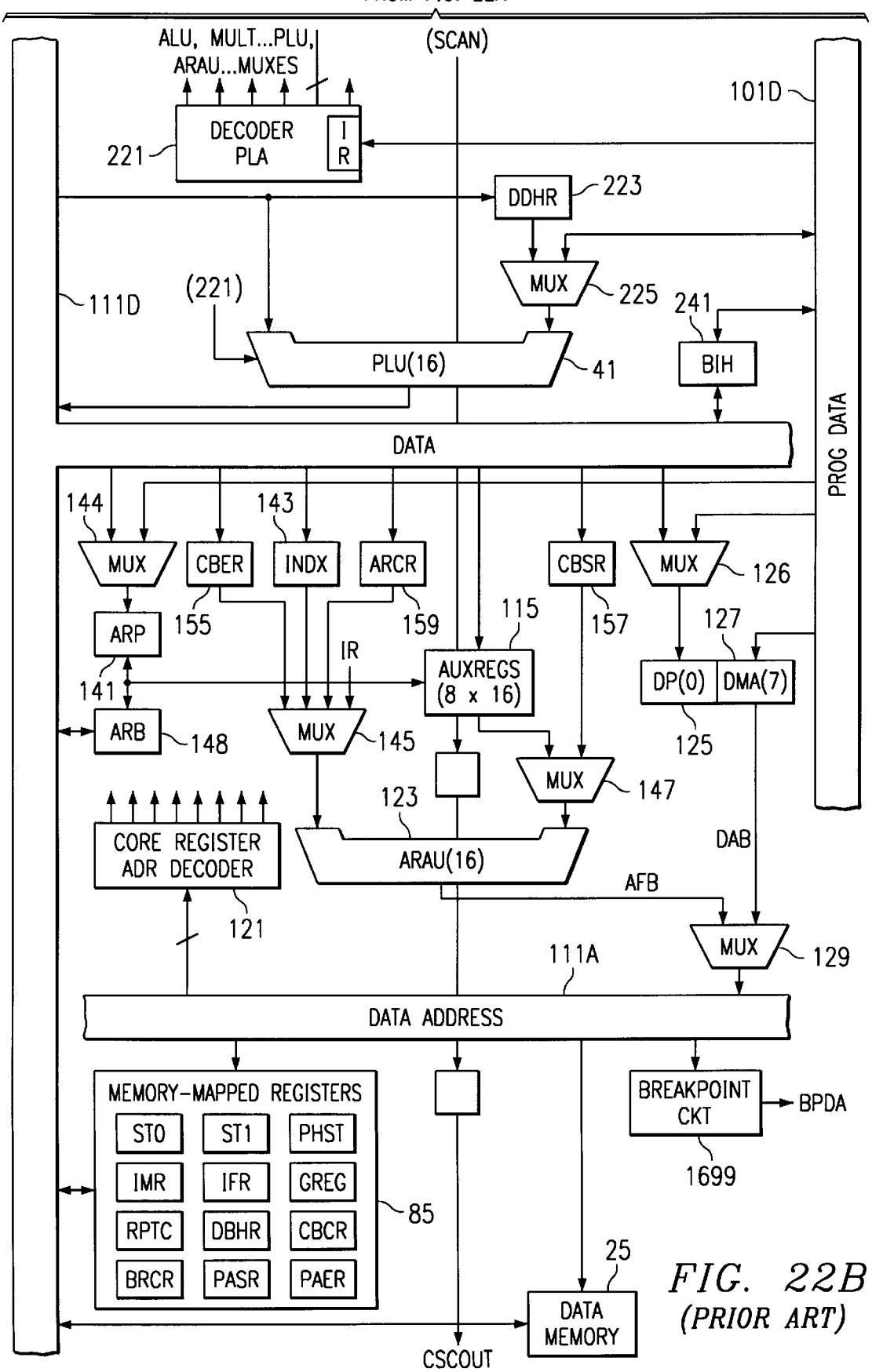

FIGS. 22A and 22B show a block diagram of functional circuitry of CPU core domain 1213 which is improved with a series of scan registers indicated as small squares fed from input CSCIN. The CPU core was mostly described in U.S. Pat. No. 5,072,418. The detail of the organization of the scan registers and the associated MPSD module circuits for several modules is suppressed for clarity in FIGS. 22A and 22B.

CPU core is further improved by providing a trace stack circuit 1695 distinct from program counter stack 91. Unlike stack 91, trace stack circuit 1695 develops a history of program counter discontinuities and produces a TRFUL trace stack full signal when it is filled to capacity.

A hardware breakpoint circuit 1697 is connected to program address bus 101A and produces a program address break point signal BPPA when a particular program address or address in a predetermined range of program addresses is encountered.

In FIG. 22B, a hardware breakpoint circuit 1699 is connected to data address bus 111A and produces a data address break point signal BPDA when a particular data address or address in a predetermined range of data addresses is encountered.

For scan purposes, trace stack 1695, and breakpoint circuits 1697 and 1699 are on the separate scan path for the analysis domain 1217. The core however is on the scan path for core domain 1213.

Figure 23:
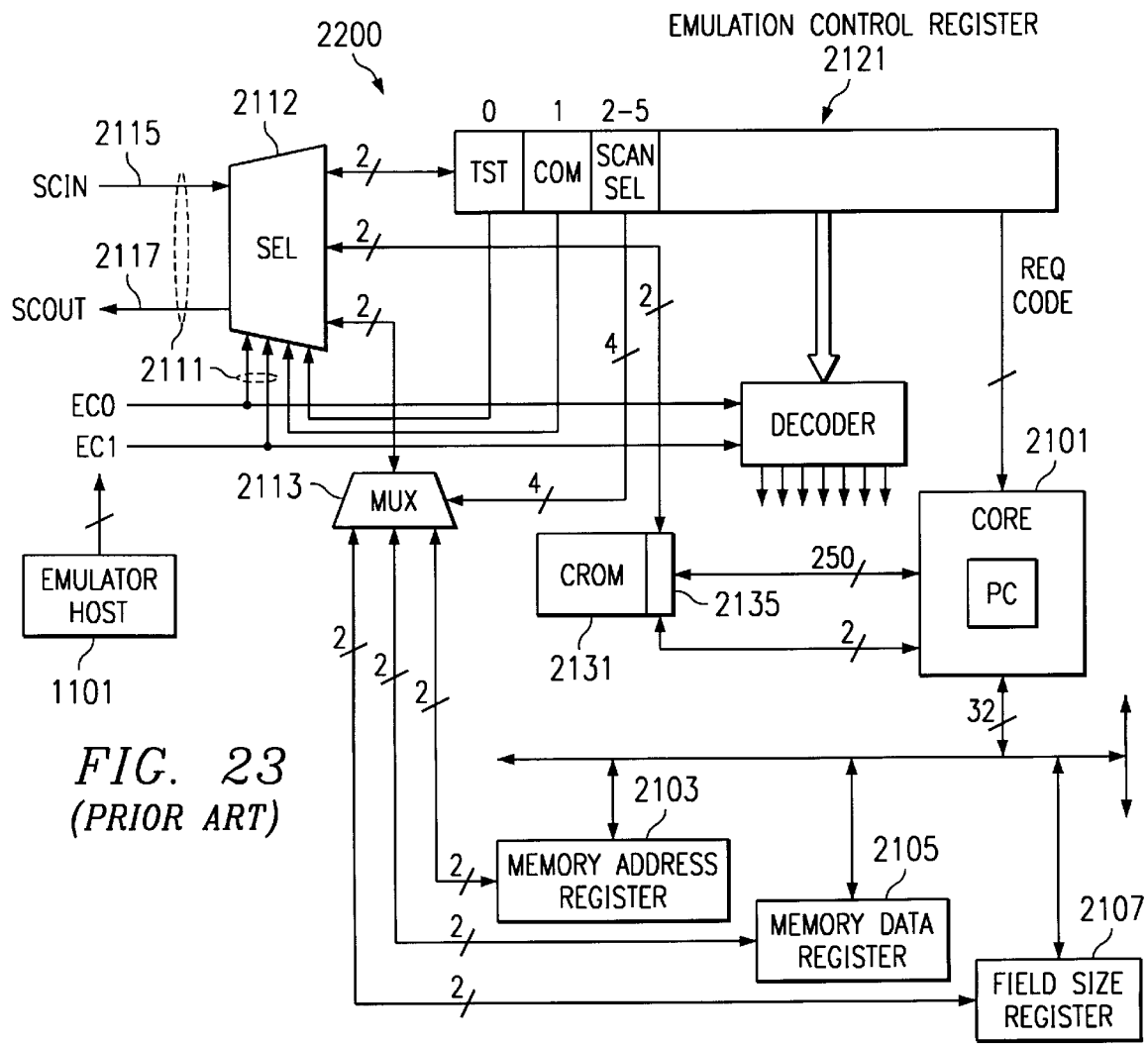
FIG. 23 is a more detailed block diagram of a CPU portion of a graphics system processor chip showing testability, emulation and simulation circuitry.

FIG. 23 shows a block diagram of the central processing unit of the graphics system processor.

For the purposes of testability, the GSP 2120 memory elements are split into two types:

(1) Multiple-bit registers such as those in the register file 2220, the Cache RAM 2230, a memory address register 2103, memory data register 2105 and a field size register 2107. These are all on wide buses, and sufficient logic is included to ensure that there is a route from each of these registers to local address data (LAD) pins of the chip.

(2) Serial latches, such as an emulation control register 2121, buffer SRLs 2135 of a control ROM (CROM) 2131, and scanable registers of core processing circuitry 2101 on chip. These are put on two scan paths and are accessible via two bidirectional pins SCIN and SCOUT- in test mode. Extra latches are suitably placed as desired to easily observe key logic elements.

Figure 24:
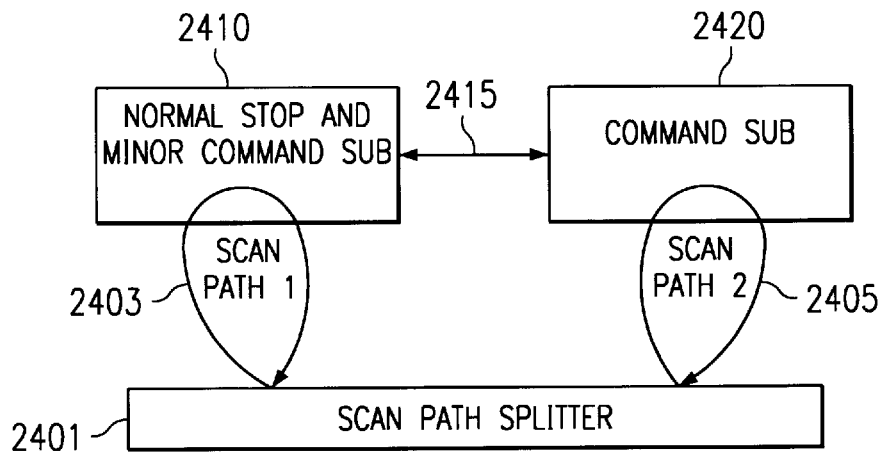
FIG. 24 illustrates an alternative employing two linked state machines in accordance with this invention.

FIG. 24 illustrates an alternate arrangment for specifying the emulation command. The serial scan path is connected to first state machine 2410 and to second state machine 2420. As previously described a first scan path 2401 is used in the JTAG testability interface. First state machine 2410 receives input data on second scan path 2403. Second state machine 2420 receives input data on third scan path 2405. The state of first state machine 2410 determines the class of emulation command implemented. Second state machine 2420 receives some state information from first state machine 2410 via line 2415. Alternatively, each state machine transmits information that effects the state of the other state machine. The state of second state machine 2420 determines the emulation command implemented within the emulation command class specified by first state machine 2410. Thus the emulation command implemented depends upon the state of both first state machine 2410 and second state machine 2420.

Breaking the emulation command specification between two state machines is advantageous when the emulation command set includes numerous and/or complex commands. In this event a single state machine specifying the emulation commands becomes too cumbersome and complex for easy design. Breaking the specification into emulation command class and emulation command within the specified class reduces the complexity of the design. To ease the design problem, both the first state machine 2410 and the second state machine 2420 resume a default "no-op" state upon performance of the emulation command. Each of the state machines 2410 and 2420 must be changed from their default "no-op" state to enable an emulation command. When performing normal JTAG operation both the first and second state machines 2410 and 2420 are in this default "no-op". Alternatively, the first state machine 2410 receives data placing it in a "normal JTAG operation" command class when JTAG operations are performed.

Figure 25:
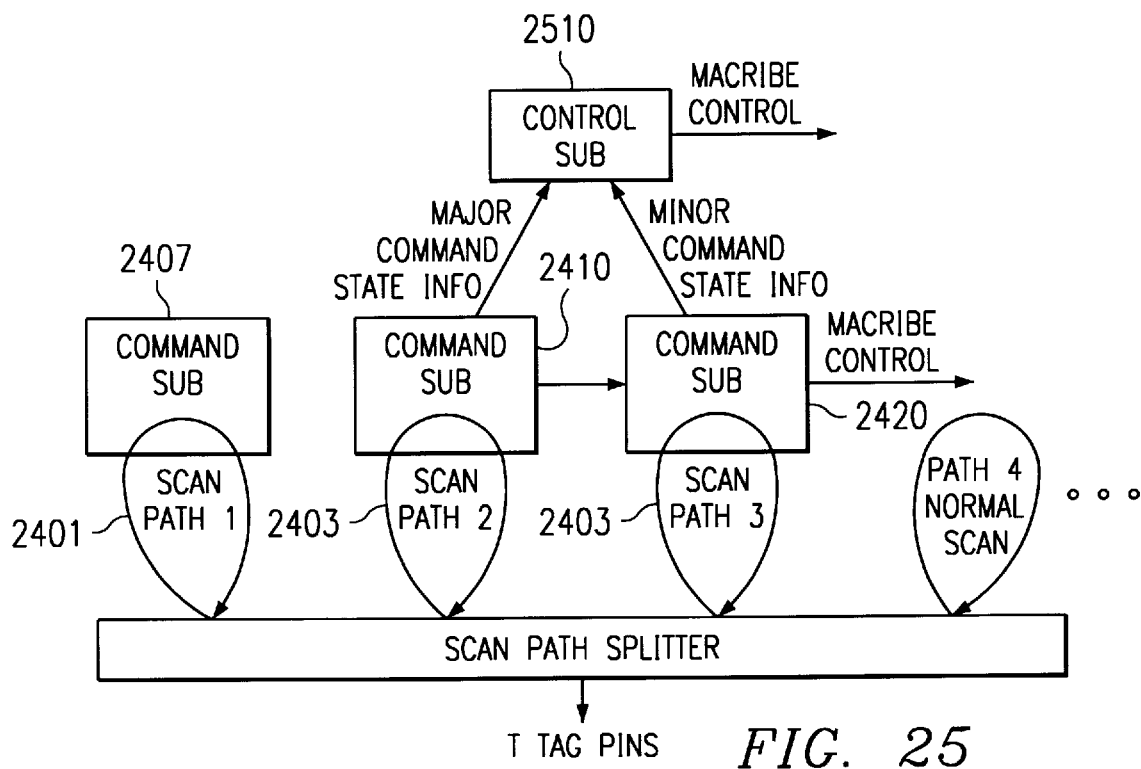
FIG. 25 illustrated an alternative employing three linked state machines in accordance with this invention.

A further alternative is illustrated in FIG. 25. In FIG. 25 a third state machine 2510 is added. Third state machine 2510 is responsive to the state of both first state machine 2410 and second state machine 2420. The emulation command performed depends upon the state of third state machine 2510.

What is claimed is:

1. An emulation device which enables a functional circuit to support self emulation, comprising:
   a serial scan testability interface having at least first, second and third scan paths, said first scan path being provided for applying digital information to the functional circuit for use in emulation of the functional circuit;
   a first state machine connected to said second scan path having a first state selected from among a first set of states;
   a second state machine connected to said said third scan path having a second state selected from among a second set of states;
   said emulation device performing an emulation command based on a combined first state of said first state machine and second state of said second state machine.

2. The emulation device of claim 1 wherein:
   said first state machine transmits state information corresponding to said first state to said second state machine.

3. The emulation device of claim 1 wherein:
   said first state of said first state machine indicates a first portion of said emulation command; and
   said second state of said second state machine indicates a second portion of said emulation command.

4. The emulation device of claim 3 wherein:
   said first portion of said emulation command consists of an emulation command class; and
   said second portion of said emulation command consists of a subtype within said emulation command class.

5. The emulation device of claim 1 wherein:
   said emulation device performs said emulation command only if both said first state of said first state machine and said second state of said second state machine are updated by said respective second and third scan paths.

6. The emulation device of claim 1 wherein:
   both said first state machine and said second state machine return to a default "no-op" state following performance of an emulation command prior to accepting data via said respective second and third scan paths.

7. The emulation device of claim 6 wherein:
   said first and second state machines may only accept data via said respective second and third scan paths if said state machine is in said default state; and
   said emulation command can only be performed if both said first and said second state machines are not in said default state.

8. An emulation device which enables a functional circuit to support self emulation, comprising:
   a serial scan testability interface having at least first, second and third scan paths, said first scan path being provided for applying digital information to the functional circuit for use in emulation of the functional circuit;
   a first state machine connected to said second scan path having a first state selected from among a first set of states;
   a second state machine connected to said third scan path having a second state selected from among a second set of states;
   a third state machine connected to the first and second state machines receiving an indication of said state of said first and second state machines, said third state machine having a third state selected from among a third set of states dependent upon both said first state and said second state; and
   said emulation device performing an emulation command based on said third state of said third state machine.

9. The emulation device of claim 8 wherein:
   said emulation device performs said emulation command only if both said first state of said first state machine and said second state of said second state machine are updated by said respective second and third scan paths.

10. The emulation device of claim 8 wherein:
    both said first state machine and said second state machine return to a default "no-op" state following performance of an emulation command prior to accepting data via said respective second and third scan paths.

11. The emulation device of claim 10 wherein:
    said first and second state machines may only accept data via said respective second and third scan paths if said state machine is in said default state; and
    said emulation command can only be performed if both said first and said second state machines are not in said default state.

12. An emulation device which enables a functional circuit to support self emulation, comprising:
    a serial scan testability interface having at least first, second and third scan paths, said first scan path being provided for applying digital information to the functional circuit for use in emulation of the functional circuit;
    a first state machine connected to said second scan path having a first state selected from among a first set of states;
    a second state machine connected to said third scan path having a second state selected from among a second set of states;
    said first state machine receiving a first portion of an emulation command, said second state machine receiving a second portion of an emulation command and each of said first and second state machines passing corresponding state information to the other state machine; and
    said emulation device performing an emulation command based on a combined first state of said first state machine and second state of said second state machine.

13. The emulation device of claim 12 wherein:
    said first state machine initially processes said first portion of said emulation command;
    said second state machine receiving said second portion of said emulation command and said first state of said first state machine and then processes said second portion of said emulation command.

14. The emulation device of claim 12 wherein:
    said first state of said first state machine indicates a primary portion of said emulation command; and
    said second state of said second state machine indicates a second portion of said emulation command.

15. The emulation device of claim 14 wherein:
    said first portion of said emulation command consists of an emulation command class; and
    said second portion of said emulation command consists of a subtype within said emulation command class.

16. The emulation device of claim 12 wherein:
    said emulation device performs said emulation command only if both said first state of said first state machine and said second state of said second state machine are updated by said respective second and third scan paths.

17. The emulation device of claim 12 wherein:

both said first state machine and said second state machine return to a default "no-op" state following performance of an emulation command prior to accepting data via said respective second and third scan paths.

18. The emulation device of claim 17 wherein:

said first and second state machines may only accept data via said respective second and third scan paths if said state machine is in said default state; and said emulation command can only be performed if both said first and said second state machines are not in said default state.

19. The emulation device of claim 12 wherein:

said first scan path is used for JTAG when said first state of said first state machine is said default "no-op" state.

20. The emulation device of claim 12 wherein:

said first scan path is used for JTAG when said first state of said first state machine is in a "JTAG operation" state.

21. The emulation device of claim 12 wherein:

said second state of said second state machine indicates a first portion of said emulation command; and said first state of said first state machine indicates a second portion of said emulation command.

22. The emulation device of claim 21 wherein:

an unused JTAG command on said first scan path indicates to said second state machine that the following bit string is a command class and not a JTAG operation.

23. An emulation device which enables a functional circuit to support self emulation, comprising:

a serial scan testability interface having at least first and second scan paths, said first scan path being provided for applying digital information to the functional circuit for use in emulation of the functional circuit;

a first state machine connected to said second scan path having a first state selected from among a first set of states;

a second state machine connected to said first scan path having a second state selected from among a second set of states;

said emulation device performing an emulation command based on a combined first state of said first state machine and second state of said second state machine.

24. The emulation device of claim 23 wherein:

said first state machine initially processes a first portion of said emulation command;

said second state machine receiving a second portion of said emulation command and said first state of said first state machine and then processes said second portion of said emulation command.

25. The emulation device of claim 23 wherein:

said first state of said first state machine indicates a first portion of said emulation command; and said second state of said second state machine indicates a second portion of said emulation command.

26. The emulation device of claim 25 wherein:

said first portion of said emulation command consists of an emulation command class; and said second portion of said emulation command consists of a subtype within said emulation command class.

27. The emulation device of claim 23 wherein:

said emulation device performs said emulation command only if both said first state of said first state machine and said second state of said second state machine are updated by said respective second and third scan paths.

28. The emulation device of claim 27 wherein:

both said first state machine and said second state machine return to a default "no-op" state following performance of an emulation command prior to accepting data via said respective second and third scan paths.

29. The emulation device of claim 27 wherein:

said first and second state machines may only accept data via said respective second and third scan paths if said state machine is in said default state; and said emulation command can only be performed if both said first and said second state machines are not in said default state.

30. The emulation device of claim 27 wherein:

said first scan path is used for JTAG when said first state of said first state machine is said default "no-op" state.

31. The emulation device of claim 23:

said first scan path is used for JTAG when said first state of said first state machine is a "normal JTAG operation" command class.

32. The emulation device of claim 23 wherein:

an unused JTAG command indicates to the first state machine that the following bit string is a command class and not a JTAG operation.

* * * * *